(12) United States Patent
Miyajima et al.

(10) Patent No.: US 7,538,404 B2
(45) Date of Patent: May 26, 2009

(54) OPTICAL SEMICONDUCTOR DEVICE AND METHOD FOR MANUFACTURING THE SAME

(75) Inventors: Tsutomu Miyajima, Osaka (JP); Takaki Iwai, Osaka (JP); Hisatada Yasukawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 123 days.

(21) Appl. No.: 11/489,577

(22) Filed: Jul. 20, 2006

(65) Prior Publication Data

US 2007/0023770 A1 Feb. 1, 2007

(30) Foreign Application Priority Data

Jul. 27, 2005 (JP) ............... 2005-217741

(51) Int. Cl.
*H01L 31/058* (2006.01)
(52) U.S. Cl. .................. 257/431; 257/437; 257/440; 257/451; 257/464; 257/E21.029
(58) Field of Classification Search .......... 257/431, 257/437, 440, 451, 464, E21.029
See application file for complete search history.

(56) References Cited

U.S. PATENT DOCUMENTS 5,449,943 A * 9/1995 Kasai et al. ............... 257/437
5,486,719 A * 1/1996 Sugiura et al. ............ 257/641
5,726,440 A * 3/1998 Kalkhoran et al. ....... 250/214.1

FOREIGN PATENT DOCUMENTS

| JP | 10-107312 A | 4/1998 |
| JP | 2002-118281 A | 4/2002 |

* cited by examiner

*Primary Examiner*—N Drew Richards
*Assistant Examiner*—Swapneel Chhaya
(74) *Attorney, Agent, or Firm*—McDermott Will & Emery LLP

(57) ABSTRACT

An optical semiconductor device includes a first light receiving region and a second light receiving region provided on a substrate and the first and second light receiving regions include light receiving elements, respectively. A first anti-reflection film is formed in the first light receiving region of the substrate and a second anti-reflection film is formed in the second light receiving region of the substrate. The reflectance of the first anti-reflection film for a first wavelength range of light is lower than the reflectance of the second anti-reflection film for the first wavelength range of light and the reflectance of the second anti-reflection film for a second wavelength range of light which is different from the first wavelength range of light is lower than the reflectance of the first anti-reflection film for the second wavelength range of light.

7 Claims, 15 Drawing Sheets

OPTICAL SEMICONDUCTOR DEVICE AND METHOD FOR MANUFACTURING THE SAME

BACKGROUND OF THE INVENTION

1. Field of the Invention

The present invention relates to an optical semiconductor device including a light receiving element for converting an optical signal to an electric signal and a method for manufacturing the same.

2. Description of Related Art

Light receiving elements convert an optical signal to an electric signal and are used for control sensors. Specifically, the light receiving elements are incorporated in optical pickups for reading/writing signals from/in optical disks, such as DVDs (Digital Versatile Disks) and CDs (Compact Disks).

In recent years, with an increase in data storage capacity and transfer rate, the light receiving elements for use in the optical pickups are required to have high sensitivity to light, reduced noise and enhanced speed.

As the optical disks are becoming denser, the wavelength of a laser light used for reproducing/recording information from/in the optical disks is becoming shorter. So far, an infrared laser of 780 nm wavelength is used for CDs and a red laser of 650 nm wavelength is used for DVDs. Now, development has been proceeding such that a blue laser of about 405 nm wavelength is used for high-density DVDs.

However, the sensitivity of a light receiving element to light is likely to decrease as the laser wavelength becomes short. Suppose that light is absorbed 100% by silicon as material for the light receiving element and completely converted into electricity, sensitivity to light S is proportional to the wavelength of incident light and represented as $S=q\lambda/hc$. In the equation, q indicates the quantity of electric charge per electron, $\lambda$ is the wavelength of incident light (laser light), h is Plank constant and c is light velocity.

Especially in recent years, from the viewpoints of noise reduction and downsizing, there has been required an optical pickup in which a plurality of light receiving elements corresponding to various wavelengths of incident light are integrated on a single semiconductor substrate.

For the purpose of improving the sensitivity to light and reducing the reflectance of incident light at the surface of the light receiving element, a technique of forming an insulating film made of an oxide film and a nitride film as an anti-reflection film on the surface of the light receiving element is generally used as disclosed by Japanese Unexamined Patent Publication No. H10-107312.

(Conventional Technique 1)

Hereinafter, an explanation of an example of a conventional optical semiconductor device including an anti-reflection film on the surface of the light receiving element will be provided with reference to the drawing.

FIG. 14 is a sectional view illustrating a light receiving element including an anti-reflection film which is formed on a diffusion layer in a light receiving region.

A photodiode 11 as an optical semiconductor device includes an $N^-$-type Si substrate 12. A $P^+$-type diffusion layer 13 is formed in the surface of the Si substrate 12 by impurity diffusion as a light receiving region and an anti-reflection film 14 is formed on the $P^+$-type diffusion layer 13.

An electrode 15 for the light receiving region is formed on the Si substrate 12 to be adjacent to the anti-reflection film 14 and an electrode 16 for the substrate is formed to be spaced from the electrode 15. The electrode 15 is electrically connected to a light receiving diffusion layer 13 through a $P^+$-type diffusion region 17 below the light receiving electrode 15. The electrode 16 is electrically connected to the Si substrate 12 through an $N^+$-type diffusion region 18 formed below the electrode 16.

The anti-reflection film 14 is a layered film including a silicon oxide film 19 formed on the light receiving diffusion layer 13 and a silicon nitride film 20 formed on the silicon oxide film 19.

With the anti-reflection film 14 formed on the $P^+$-type diffusion layer 13 (light receiving region), the reflectance of light at the surface of the $P^+$-type diffusion layer 13 approaches 0%. In other words, the ratio of light absorbed into the Si substrate 12 approaches 100%. As a result, light is effectively absorbed into the light receiving region for use in photoelectric conversion while the waste of light at the outside of the light receiving region is reduced. That is, the light receiving element improves in sensitivity to incident light.

According to the conventional technique 1 described above, the obtained device shows a transmittance of at most about 94% when the silicon oxide film 19 is 50 to 90 nm thick, the silicon nitride film 20 is 80 to 100 nm thick and a short wavelength of light, i.e., i rays ($\lambda=365$ nm), is incident thereon.

The optimum structure and thickness of the anti-reflection film for minimizing the reflectance of the incident light (maximizing the transmittance) vary depending on the wavelength of the incident light. Therefore, in order to provide an optical pickup corresponding to various wavelengths of light by the conventional technique 1, various OEICs (Opto-Electronic Integrated Circuits) suitable for different wavelengths of incident light, respectively, need to be mounted. For example, the pickup is required to have an OEIC including a light receiving element suitable for a wavelength of 650 nm for DVD and an OEIC including a light receiving element suitable for a wavelength of 405 nm for high-density DVD. However, this is contradictory to the downsizing of the device.

In this respect, for example, Japanese Unexamined Patent Publication No. 2002-118281 proposes a technique of providing an optical pickup in which a single chip corresponds to a plurality of wavelengths of light. An explanation of this technique is provided below.

(Conventional Technique 2)

Hereinafter, with reference to the drawing, an explanation of an optical pickup in which a plurality of light receiving elements are buried in a single substrate at different depths to correspond to different wavelengths of light will be provided with reference to the drawing.

FIG. 15 is a view illustrating the section of light receiving elements incorporated in an optical pickup corresponding to a plurality of wavelengths of light.

According to the conventional technique 2, a Si substrate 40 is prepared by depositing a 10 μm thick low concentration impurity layer 31 on an $N^-$-type Si base substrate 30. The Si substrate 40 is integrated with three light receiving elements, i.e., a light receiving element 41 for CD, a light receiving element 42 for DVD and a light receiving element for high-density DVD.

In the light receiving element 41, an $N^+$-type buried layer 51 is formed at the interface between the $N^-$-type Si base substrate 30 and the low concentration impurity layer 31. The potential of the $N^+$-type buried layer 51 is drawn to the surface of the Si substrate 40 via a contact 61.

In the light receiving element 42, an $N^+$-type buried layer 52 is formed in the Si substrate 40 at a depth of 7 μm from the top surface of the Si substrate 40 (the surface of the low concentration impurity layer 31). The potential of the N$^+$-type buried layer 52 is drawn to the surface of the Si substrate 40 via a contact 62.

In the light receiving element 43, an N$^+$-type buried layer 53 is formed in the Si substrate 40 at a depth of 4 μm from the top surface of the Si substrate 40 (the surface of the low concentration impurity layer 31). The potential of the N$^+$-type buried layer 53 is drawn to the surface of the Si substrate 40 via a contact 63.

Further, P$^+$-type diffusion layers 71, 72 and 73 are formed in parts of the surface of the Si substrate 40 above the N$^+$-type buried layers 51, 52 and 53, respectively.

The light receiving device using the Si substrate 40 shows different absorption coefficients α depending on the wavelength of incident light. Specifically, in order to capture light 81 of wavelength 780 nm for CD with high efficiency, a distance of about 10 μm is required from the substrate surface to the N$^+$-type buried layer 51 because the absorption coefficient α for the light 81 is extremely low. In order to capture light 82 of wavelength 650 nm for DVD, the required distance from the substrate surface to the N$^+$-type buried layer 52 is about 7 μm because the absorption coefficient α for the light 82 is higher than that for the light 81. Further, in order to capture light 83 of wavelength 405 nm for high-density DVD, the required distance from the substrate surface to the N$^+$-type buried layer 53 of about 405 nm is sufficient because the absorption coefficient α for the light 83 is much higher.

In order to use the captured light with efficiency (improve internal quantum efficiency), the depths of the N$^+$-type buried layers 51, 52 and 53 are optimized according to the corresponding wavelengths of light, respectively, thereby reducing loss of light in the Si substrate 40.

As described above, the buried layers are formed in a single substrate in several steps. Specifically, the buried layer for receiving a short wavelength laser light is formed in a shallower position than the position of the buried layer for receiving a long wavelength laser light. Thus, sufficient sensitivity is achieved to various wavelengths of incident light.

SUMMARY OF THE INVENTION

According to the conventional technique 2, it is possible to form the light receiving elements corresponding to different wavelengths of light in a single substrate. However, for that purpose, it is necessary to form the buried layers at optimum depths according to the wavelengths of the incident light in separate steps. As a result, the structure of the device is complicated and the number of manufacturing steps increases, resulting in cost increase.

Further, although the conventional technique 2 improves the internal quantum efficiency (the ratio of incident light used in the substrate), it does not improve external quantum efficiency (the ratio of incident light passing through the surface of the light receiving region). That is, a problem still remains unsolved in that it is necessary to optimize the structure of the anti-reflection film as the wavelength of incident light varies.

In view of the above-described problems, the present invention provides an optical semiconductor device including a plurality of light receiving elements formed in a single substrate and show high sensitivity to different wavelengths of light, respectively, without complicating the structure and increasing the number of manufacturing steps and a method for manufacturing the optical semiconductor device.

An optical semiconductor device of the present invention includes: a first light receiving region and a second light receiving region provided on a substrate and include light receiving elements, respectively; and a first anti-reflection film formed in the first light receiving region of the substrate and a second anti-reflection film formed in the second light receiving region of the substrate, wherein the reflectance of the first anti-reflection film for a first wavelength range of light is lower than the reflectance of the second anti-reflection film for the first wavelength range of light and the reflectance of the second anti-reflection film for a second wavelength range of light which is different from the first wavelength range of light is lower than the reflectance of the first anti-reflection film for the second wavelength range of light.

According to the optical semiconductor device of the present invention, the first light receiving region improves the sensitivity to the first wavelength range of light and the second light receiving region improves the sensitivity to the second wavelength range of light. Further, the two different kinds of light receiving regions are provided on a single substrate. Reasons for these achievements are described below. The sensitivity of the light receiving regions to light mentioned herein refers to both the ratio of incident light passing through the anti-reflection films and the ratio of light absorbed in the light receiving elements.

If the reflectance of the anti-reflection film formed on the surface of the light receiving region (substrate) is reduced, the amount of light absorbed in the light receiving region (the light received by a light receiving element formed in the light receiving region) increases. Therefore, the sensitivity of the light receiving region to light improves.

In the optical semiconductor device of the present invention, the first anti-reflection film formed in the first light receiving region and the second anti-reflection film formed in the second light receiving region have different reflectances for any given wavelength ranges of light. More specifically, the reflectance of the first anti-reflection film for the first wavelength range of light is lower than the reflectance of the second anti-reflection film for the first wavelength range of light. At the same time, the reflectance of the second anti-reflection film for the second wavelength range of light is lower than the reflectance of the first anti-reflection film for the second wavelength range of light which is different from the first wavelength range of light.

As described above, the reflectance of the first anti-reflection film is optimized (reduced) for the first wavelength range of light, thereby improving the sensitivity of the first light receiving region to the first wavelength range of light. Likewise, the reflectance of the second anti-reflection film is optimized (reduced) for the second wavelength range of light, thereby improving the sensitivity of the second light receiving region to the second wavelength range of light. This makes it possible to incorporate a light receiving element having enhanced sensitivity to a red laser light for DVD and a light receiving element having enhanced sensitivity to a blue laser light for high-density DVD in a single substrate of the optical semiconductor device.

It is preferred that the first anti-reflection film and the second anti-reflection film are made of different materials.

According to the preferred structure, the reflectance spectrum of the first anti-reflection film is varied from that of the second anti-reflection film. The reflectance spectrum mentioned herein is obtained by different reflectances for the wavelengths of light applied thereto. The difference in reflectance spectrum between the first and second anti-reflection films depend on the difference in material and thickness of the anti-reflection films and the difference in what lies above the anti-reflection films (air or resin), for example. Therefore, the first and second anti-reflection films establish the relationship as to the reflectance according to the present invention, i.e., the reflectance of the first anti-reflection film for the first wavelength range of light is lower than the reflectance of the second anti-reflection film for the first wavelength range of light and the reflectance of the second anti-reflection film for the second wavelength range of light which is different from the first wavelength range of light is lower than the reflectance of the first anti-reflection film for the second wavelength range of light.

The relationship is established on condition that the first and second anti-reflection films made of different materials have different refractive indices and therefore show reflectances different from each other for various wavelength ranges of light. Thus, the optical semiconductor device is surely provided with the light receiving regions optimized for different wavelength ranges of light, respectively.

It is preferred that the first anti-reflection film is thicker than the second anti-reflection film.

According to the preferred structure, the relationship as to the reflectance according to the present invention is established by the first and second anti-reflection films.

It is preferred that the first anti-reflection film and the second anti-reflection film are made of silicon nitride films, respectively, and the silicon nitride film serving as the first anti-reflection film is implanted with impurities such that the refractive index of the first anti-reflection film is varied from the refractive index of the second anti-reflection film.

According to the preferred structure, the first and second anti-reflection films are made of the same silicon nitride film and the first anti-reflection film is implanted with impurities to have a refractive index different from that of the second anti-reflection film which is not implanted with the impurities. As a result, the reflectances of the first and second anti-reflection films are varied from each other. Thus, the relationship as to the reflectance according to the present invention is established by the first and second anti-reflection films.

It may be possible to use other material film than the silicon nitride film as the first and second anti-reflection films and implant impurities into the first anti-reflection film. However, significant effect is obtained when the silicon nitride film is used.

It is preferred that the first anti-reflection film is a layered film including a plurality of films and the second anti-reflection film is a single-layered film.

According to the preferred structure, the first and second anti-reflection films are given with different structures. Therefore, the relationship as to the reflectance according to the present invention is established by the first and second anti-reflection films. The first anti-reflection film may be a layered film including two films made of different materials.

The second anti-reflection film may also be a layered film including a plurality of films. In this case, for example, the number of material films for the first anti-reflection film may be varied from the number of material films for the second anti-reflection film such that the first and second anti-reflection films have reflectance spectra different from each other. Even if the first and second anti-reflection films include the same number of material films, the reflectances of the first and second anti-reflection films may be varied by using different combinations of the material films for the first and second anti-reflection films or changing the stacking order of the material films.

It is preferred that the first anti-reflection film is a layered film including a silicon oxide film and a silicon nitride film and the second anti-reflection film is a single-layered film made of a silicon oxide film.

It is preferred that the first anti-reflection film is a layered film including a silicon oxide film and a silicon nitride film and the second anti-reflection film is a single-layered film made of a silicon nitride film.

When the first anti-reflection film is a layered film and the second anti-reflection film is a single-layered film, the above-described preferred structures may be employed.

A method for manufacturing an optical semiconductor device of the present invention includes the steps of: (a) forming light receiving elements in a first light receiving region and a second light receiving region defined on a substrate, respectively; and (b) forming a first anti-reflection film in the first light receiving region of the substrate and a second anti-reflection film in the second light receiving region of the substrate, wherein the reflectance of the first anti-reflection film for a first wavelength range of light is lower than the reflectance of the second anti-reflection film for the first wavelength range of light and the reflectance of the second anti-reflection film for a second wavelength range of light which is different from the first wavelength range of light is lower than the reflectance of the first anti-reflection film for the second wavelength range of light.

According to the method of the present invention, an optical semiconductor device is achieved in which a first light receiving region improved in sensitivity to the first wavelength range of light and a second light receiving region improved in sensitivity to the second wavelength range of light are formed in a single substrate. This is because the first light receiving region includes a first anti-reflection film which shows a reduced reflectance for the first wavelength range of light and the second light receiving region includes a second anti-reflection film which shows a reduced reflectance for the second wavelength range of light.

Other parts than the first and second anti-reflection films in the first and second light receiving regions, e.g., light receiving elements formed in the two regions, respectively, may have the same structure. Therefore, the number of steps of forming the first and second light receiving regions which are optimized for different wavelength ranges of light, respectively, may be reduced as compared with the number of steps of forming the light receiving elements having different structures in the light receiving regions, respectively.

It is preferred that the step (b) includes the steps of: forming a first material film on the substrate including the first light receiving region and the second light receiving region; removing part of the first material film formed in the first light receiving region; forming a second material film on the substrate including the first light receiving region and the second light receiving region; and removing part of the second material film formed in the second light receiving region using the first material film as an etch stopper.

According to the preferred structure, the first and second anti-refection films are made of different materials and therefore given with different reflectance spectra. If the materials for the first and second material films are combined such that etching is performed with high selectivity, only the second material film is selectively removed using the first material film as an etch stopper.

Specifically, the first material film may be a silicon oxide film and the second material film may be a silicon nitride film such that the second material film may be wet-etched using hot phosphorus acid.

It is preferred that the step (b) includes the steps of: implanting impurities in the first light receiving region of the substrate; and oxidizing the substrate to form an oxide film on the substrate including the first light receiving region and the second light receiving region, wherein the oxide film formed in the first light receiving region implanted with the impurities is thicker than the oxide film formed in the second light receiving region.

According to the preferred structure, high concentration impurities are introduced in advance in the surface of the first light receiving region of the substrate such that an oxide film grows faster in the first light receiving region than in the second light receiving region by the oxidation of the substrate. Therefore, the oxide film formed in the first light receiving region becomes thicker than that formed in the second light receiving region. As the oxide films of different thicknesses are formed by single oxidation, the number of the manufacturing steps is reduced as compared with the case where oxidation is carried out several times to form the oxide films of different thicknesses.

As the first anti-reflection film is formed thicker than the second anti-reflection film in this manner, the reflectances of the first and second anti-reflection films are varied.

Further, as the high concentration impurities are introduced in advance in the surface of the first light receiving region of the substrate, an impurity concentration gradient occurs between the inner part and the surface of the substrate. This improves the photoelectric conversion efficiency.

It is preferred that the step (b) includes the steps of: forming a silicon nitride film on the substrate including the first light receiving region and the second light receiving region; and implanting impurities in part of the silicon nitride film formed in the first light receiving region to change the refractive index of the silicon nitride film in the first light receiving region.

According to the preferred structure, the silicon nitride film in the first light receiving region is implanted with impurities to vary the refractive index, and therefore shows a reflectance different from that of the silicon nitride film in the second light receiving region which is not implanted with impurities. Thus, the relationship as to the reflectance according to the present invention is established by the first and second anti-reflection films.

If the silicon nitride film is replaced with other film, the refractive index thereof may be varied by impurity implantation. However, significant effect of varying the refractive index is obtained when the silicon nitride film is used.

It is preferred that the step (b) includes the steps of: forming a first material film on the substrate including the first light receiving region and the second light receiving region; removing part of the first material film formed in the first light receiving region; and forming a second material film which is made of material different from that of the first material film on the substrate including the first light receiving region and the second light receiving region.

According to the preferred structure, the first anti-reflection film is made of a single-layered film including the second material film and the second anti-reflection film may be a layered-film including the first material film and the second material film stacked thereon. Due to the different layer structures, the first and second anti-reflection films show reflectances different from each other.

It is preferred that the step of forming the first material film includes the step of stacking two or more different films.

It is preferred that the step of forming the second material film includes the step of stacking two or more different films.

According to the preferred structure, the first and second anti-reflection films of various layered structures may be formed. For example, one of the first and second anti-reflection films may include a stack of three or more films. Further, both of the first and second anti-reflection films may have the layered structures, respectively.

It is preferred that the step (b) includes the steps of: forming a first material film on the substrate including the first light receiving region and the second light receiving region; forming a second material film which is made of material different from that of the first material film on the first material film; and removing part of the second material film formed in the first light receiving region using the first material film as an etch stopper.

According to the preferred structure, the first anti-reflection film may be a single-layered film made of the first material film and the second anti-reflection film may be a layered film including the first material film and the second material film stacked thereon. Further, the second material film is selectively removed with ease using the first material film as an etch stopper.

It is preferred that the step (b) includes the steps of: forming a first material film on the substrate including the first light receiving region and the second light receiving region; removing part of the first material film formed in the first light receiving region; forming a second material film which is made of material different from that of the first material film on the substrate including the first light receiving region and the second light receiving region; forming a third material film which is made of material different from that of the second material film on the second material film; and removing part of the third material film formed in the second light receiving region using the second material film as an etch stopper.

According to the preferred structure, the first anti-reflection film may be a layered film including the second material film and the third material film stacked thereon and the second anti-reflection film may be a layered film including the first material film and the second material film stacked thereon. Further, the third material film is selectively removed using the second material film as an etch stopper.

It is preferred that the step of removing part of the third material film formed in the second light receiving region is followed by the step of removing part of the second material film exposed in the second light receiving region using the first material film as an etch stopper.

According to the preferred structure, the first anti-reflection film may be a layered film including the second material film and the third material film stacked thereon and the second anti-reflection film may be a single-layered film made of the first material film. Further, the second material film is selectively removed using the first material film as an etch stopper.

As described above, the first and second anti-reflection films are given with different layered structures. Therefore, the first and second anti-reflection films show different reflectances to establish the relationship as to the reflectance according to the present invention.

As a result, the optical semiconductor device is achieved by a single substrate provided with the first light receiving region showing improved sensitivity to the first wavelength range of light and the second light receiving region showing improved sensitivity to the second wavelength range of light.

The foregoing explanation is directed to the optical semiconductor device in which two light receiving regions including the first and second light receiving regions are provided on the substrate and a method for manufacturing the same. However, the optical semiconductor device may include three or more light receiving regions and the anti-reflection films formed in the light receiving regions may have optimized (reduced) reflectances for given wavelength ranges of light, respectively. For example, a third light receiving region including a third anti-reflection film may be added to the above-described optical semiconductor device. In this case, the third anti-reflection film may have a reflectance lower than the reflectances of the first and second anti-reflection films for a third wavelength range of light which is different from the first and second wavelength ranges of light. For the first and second wavelength ranges of light, the third anti-reflection film has a reflectance larger than the reflectances of the first and second anti-reflection films.

As described above, in the optical semiconductor device of the present invention, the anti-reflection films in the plurality of light receiving regions provided on a single substrate are configured such that the light receiving regions show reduced reflectances for intended wavelength ranges of light different from each other, respectively. Therefore, the light receiving regions improve in sensitivity to the different wavelength ranges of light, respectively. As a result, for example, an optical semiconductor device is achieved in which a light receiving element having high sensitivity to a red laser light for DVD and a light receiving element having high sensitivity to a blue laser light for high-density DVD are formed in a single substrate. Such an optical semiconductor device is useful for an optical pickup used for both DVD and high-density DVD.

The method of the present invention makes it possible to provide the above-described optical semiconductor device. As other parts than the anti-reflection films may be the same among the light receiving regions, an increase in the number of steps is prevented.

DETAILED DESCRIPTION OF THE INVENTION

Figure 1:
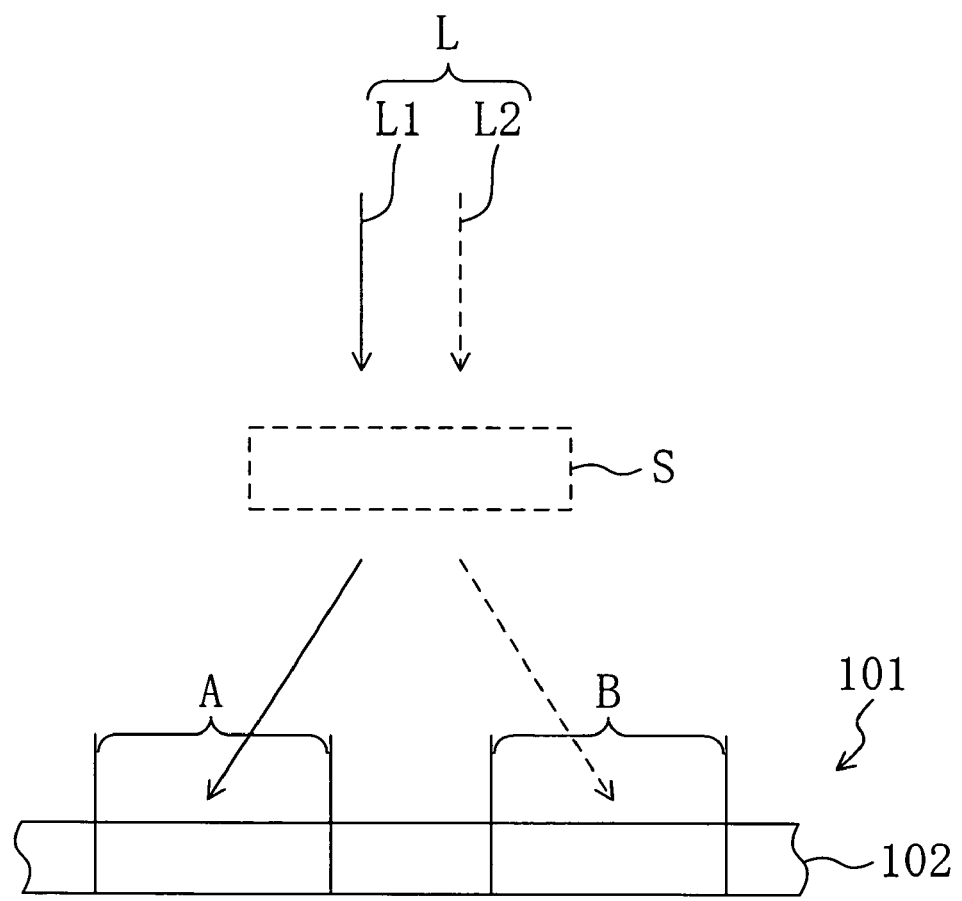
FIG. 1 is a view illustrating an optical semiconductor device according to embodiments of the present invention.

Hereinafter, an explanation of an optical semiconductor device of the present invention will be provided with reference to the drawings. In the drawings, contacts, metal wires and interlayer insulating films are omitted.

First Embodiment

FIG. 1 is a diagram illustrating an optical semiconductor device 101 according to a first embodiment of the present invention.

The optical semiconductor device 101 includes a first light receiving region A and a second light receiving region B on a semiconductor substrate 102. For example, light L incident on the optical semiconductor device 101 is divided into light L1 and light L2 by a beam splitter S according to the difference in wavelength. The divided lights L1 and L2 enter the first and second light receiving regions A and B, respectively. As a specific example, when the optical semiconductor device 101 is used for an optical pickup applicable to both of high-density DVD and DVD, light applied to an optical disk and reflected therefrom is divided according to whether the wavelength thereof is 405 nm or 650 nm and the divided lights enter the first or second light receiving region A or B. Then, lights entered the light receiving regions are taken into light receiving elements for photoelectric conversion.

Figure 2A:
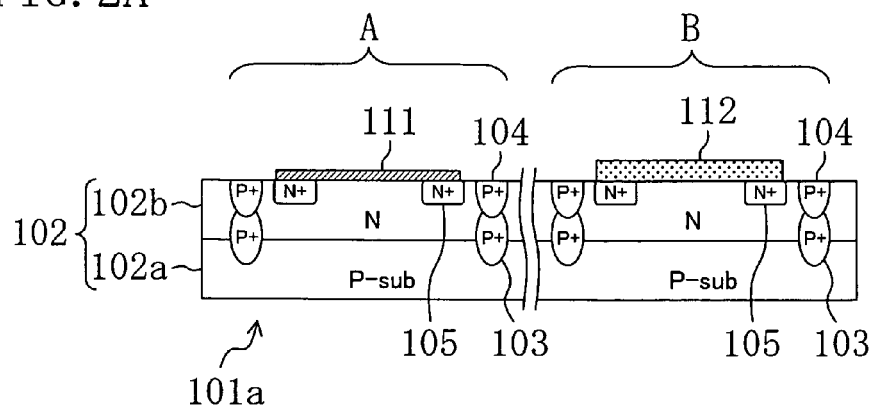
FIG. 2A is a view illustrating the structure of an optical semiconductor device 101 according to a first embodiment and FIG. 2B is a graph illustrating the reflectance spectra of a first light receiving region A and a second light receiving region B of the optical semiconductor device 101.

FIG. 2A is a schematic view illustrating the sectional structure of an optical semiconductor device 101a as a specific example of the optical semiconductor device 101. The optical semiconductor device 101a is made of a substrate 102 prepared by forming an N-type epitaxial layer 102b on a P-type Si substrate 102a. A PN junction provided therein functions as a light receiving element.

A first light receiving region A and a second light receiving region B including light receiving elements for photoelectric conversion, respectively, are provided separately on the thus-prepared substrate 102. Each of the first and second light receiving regions A and B includes a $P^+$-type buried layer 103 which is selectively formed near the interface between the P-type Si substrate 102a and the N-type epitaxial layer 102b, a $P^+$-type diffusion layer 104 which is formed on the $P^+$-type buried layer 103 and an $N^+$-type diffusion layer 105 which is formed in the surface of the N-type epitaxial layer 102b. The $P^+$-type diffusion layer 104 functions as an anode lead through which the potential of the P-type Si substrate 102a is drawn to the surface of the substrate 102. The $N^+$-type diffusion layer 105 functions as a cathode lead through which the potential of the N-type epitaxial layer 102b is drawn to the surface of the substrate 102.

On the substrate 102, anti-reflection films of different materials or thicknesses are formed. Specifically, a first anti-reflection film 111 and a second anti-reflection film 112 are formed in the first and second light receiving region A and B, respectively. In general, part of light is reflected by the light receiving regions. However, the anti-reflection films alleviate the light reflection such that the light is effectively taken into the inside of the substrate. As the reflectance of light is determined by the kind of the anti-reflection film and the wavelength of the light, the first and second anti-reflection films 111 and 112 of different kinds are formed such that the first and second light receiving regions A and B are optimized for different wavelengths of light, respectively. Specifically, as it is difficult to form an anti-reflection film having low reflectance to every wavelength of light, anti-reflection films corresponding to different wavelengths of light, respectively, are formed to optimize each of the light receiving regions.

In each of the first and second light receiving regions A and B, light is absorbed in the N-type epitaxial layer 102b as a cathode layer and the P-type Si substrate 102a as an anode layer to generate electron/hole pairs. At this time, when a reverse bias voltage is applied between the P-type Si substrate 102a and the N-type epitaxial layer 102b, a depletion layer is formed near the interface between the P-type Si substrate 102a and the N-type epitaxial layer 102b. The electron/hole pairs generated near the depletion layer are divided such that the electrons flow to the $N^+$-type diffusion layer 105 serving as a cathode contact and the holes flow to the $P^+$-type diffusion layer 104 serving as an anode contact, thereby generating photoelectric current. The light receiving element functions in this manner.

Now, specific examples of the anti-reflection films and the light receiving regions will be provided below.

In the optical semiconductor device 101a of the present embodiment, a silicon nitride film of about 50 nm thick is formed as the first anti-reflection film 111 in the first light receiving region A and a silicon oxide film of about 110 nm thick is formed as the second anti-reflection film 112 in the second light receiving region B.

In the present embodiment, light is incident on the first and second light receiving regions A and B through an air layer. The air has a refractive index of 1.00, while the silicon nitride film and the silicon oxide film have a refractive index of 2.04 and 1.45, respectively.

Figure 2B:
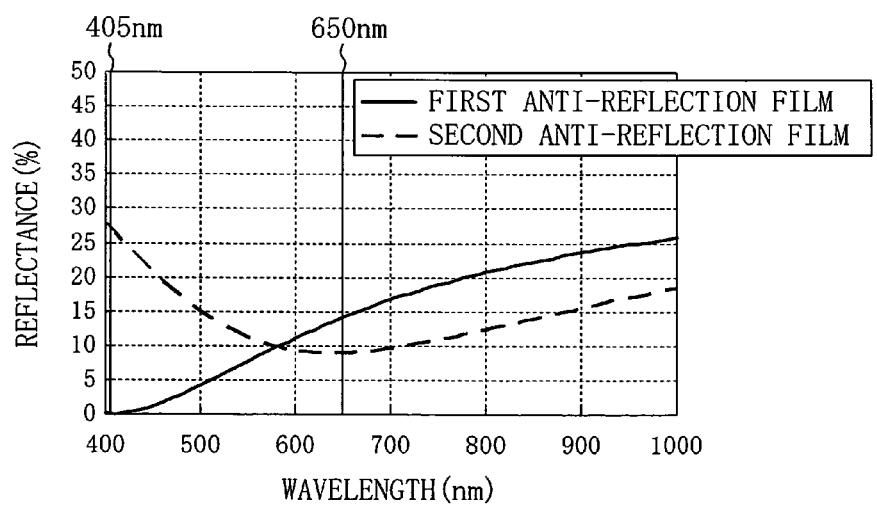

Under the above-described conditions, the first and second light receiving regions A and B show reflectance spectra as indicated in a graph of FIG. 2B.

In the optical pickup used for both high-density DVD and DVD as described above, for example, light of 405 nm wavelength reaches the first light receiving region A and light of 650 nm wavelength reaches the second light receiving region B.

As shown in FIG. 2B, for the incident light of 405 nm wavelength, the first anti-reflection film 111 made of a silicon nitride film formed in the first light receiving region A shows a reflectance of about 0.5%, while the second anti-reflection film 112 made of a silicon oxide film formed in the second light receiving region B shows a reflectance over 25%. For the incident light of 650 nm wavelength, the second anti-reflection film 112 shows a reflectance of about 9%, while the first anti-reflection film 111 shows a reflectance of about 15%.

Thus, the first and second light receiving regions A and B for receiving different wavelengths of light are provided with the first and second anti-reflection films 111 and 112 as different anti-reflection films, respectively. Therefore, the reflectance decreases in both of the first and second light receiving regions A and B, thereby improving sensitivity to light.

Thus, the optical semiconductor device 101a of the present embodiment is optimized for a plurality of wavelengths of light while the waste of light at the outside the substrate 102 is reduced. As a result, light absorption is achieved with efficiency and the sensitivity to light improves.

The materials and thicknesses of the anti-reflection films and the two wavelengths of incident light that appear in the present embodiment are described only for explanation and the present invention is not particularly limited thereto. Changing the materials and the thicknesses of the anti-reflection films makes it possible to reduce the reflectances of the light receiving regions for any given wavelengths of light, respectively, thereby improving the sensitivity of the light receiving regions to light. The anti-reflection films may have the same thickness as long as they are made of materials different from each other.

Second Embodiment

An explanation of an optical semiconductor device 101b according to a second embodiment of the present invention will be provided with reference to the drawings.

Figure 3A:
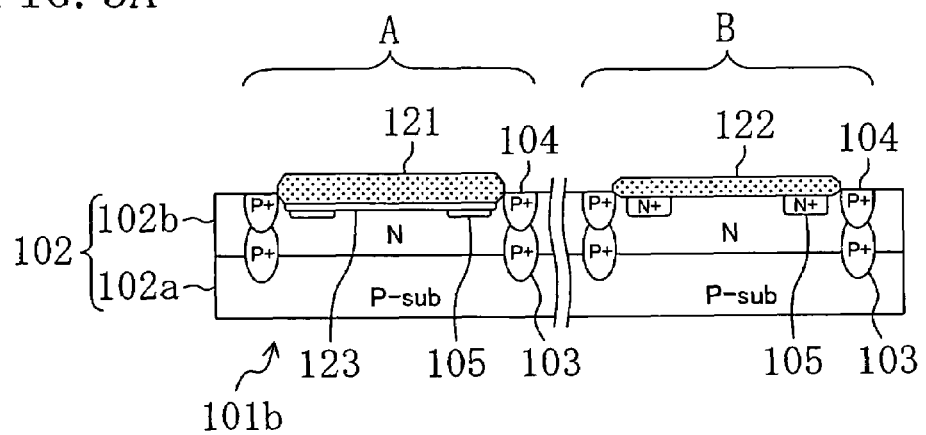
FIG. 3A is a view illustrating the structure of an optical semiconductor device 101b according to a second embodiment and FIG. 3B is a graph illustrating the reflectance spectra of a first light receiving region A and a second light receiving region B of the optical semiconductor device 101b.

FIG. 3A is a schematic view illustrating the sectional structure of the optical semiconductor device 101b. Some of the components of the optical semiconductor device 101b are common with those of the optical semiconductor device 101a of the first embodiment shown in FIG. 2A. Therefore, in FIG. 3A, such components are indicated by the same reference numerals as used in FIG. 2A to omit detailed explanation. A detailed explanation of a characteristic part of the optical semiconductor device 101b of the present embodiment will be provided below.

In the optical semiconductor device 101b, an $N^+$-type high concentration impurity region 123 having an impurity concentration of about $1 \times 10^{20}$ $cm^{-3}$ is formed in part of the surface of the N-type epitaxial layer 102b in the first light receiving region A. The impurities may be phosphorus or arsenic which is generally used in this technique. Thermal oxide films are formed as a first anti-reflection film 121 and a second anti-reflection film 122. Due to the presence of the $N^+$-type high concentration impurity region 123, thermal oxidation of the substrate 102 occurs at an increased speed in the first light receiving region A. As a result, the first anti-reflection film 121 becomes thicker than the second anti-reflection film 122. As the first and second anti-reflection films 121 and 122 have different thicknesses, their reflectance spectra are varied from each other.

Specifically, in the optical semiconductor device 101b of the present embodiment, for example, the first anti-reflection film 121 is about 140 nm thick, while the second anti-reflection film 122 is about 70 nm thick. In the present embodiment, light is incident on the light receiving regions through an air layer. The air has a reflectance of 1.00 and the anti-reflection films made of thermal oxide films have a reflectance of 1.45.

Figure 3B:
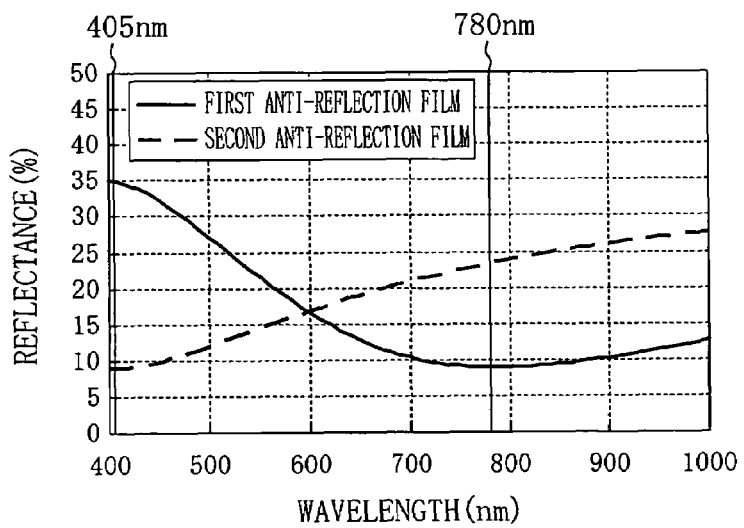

Under the above-described conditions, the first and second anti-reflection films 121 and 122 show the reflectance spectra as shown in FIG. 3B.

For light of 780 nm wavelength, the first anti-reflection film 121 of the first light receiving region A shows a reflectance of about 9%, while the second anti-reflection film 122 of the second light receiving region B shows a reflectance over 20%. For light of 405 nm wavelength, the second anti-reflection film 122 shows a reflectance of about 9%, while the first anti-reflection film 121 shows a reflectance of about 35%.

Thus, in the optical semiconductor device 101b, the first and second anti-reflection films 121 and 122 made of the same thermal oxide films are given with different thicknesses to have reflectances different from each other for any given wavelengths of light, respectively. Thus, the first and second light receiving regions A and B for receiving different wavelengths of light show reduced reflectances for given wavelengths of light different from each other, respectively, thereby improving the sensitivity to light.

In the first light receiving region A, the N$^+$-type high concentration impurity region 123 is formed in the surface of the N-type epitaxial layer 102b serving as a cathode layer. Therefore, photoelectric conversion occurs with high efficiency by making use of an impurity concentration gradient. As a result, the first light receiving region A improves the property of the light receiving element.

In the present embodiment, thermal oxide films are used as the first and second anti-reflection films. However, films made of other materials such as silicon nitride films having different thicknesses may be used as the first and second anti-reflection films. The thicknesses of the anti-reflection films, the wavelengths of the incident light and the reflectance spectra appeared herein are described only for explanation only and the present invention is not particularly limited thereto. Changing the thicknesses of the anti-reflection films makes it possible to optimize the reflectances for any other wavelengths of light, respectively.

Third Embodiment

An explanation of an optical semiconductor device 101c according to a third embodiment of the present invention will be provided with reference to the drawings.

Figure 4A:
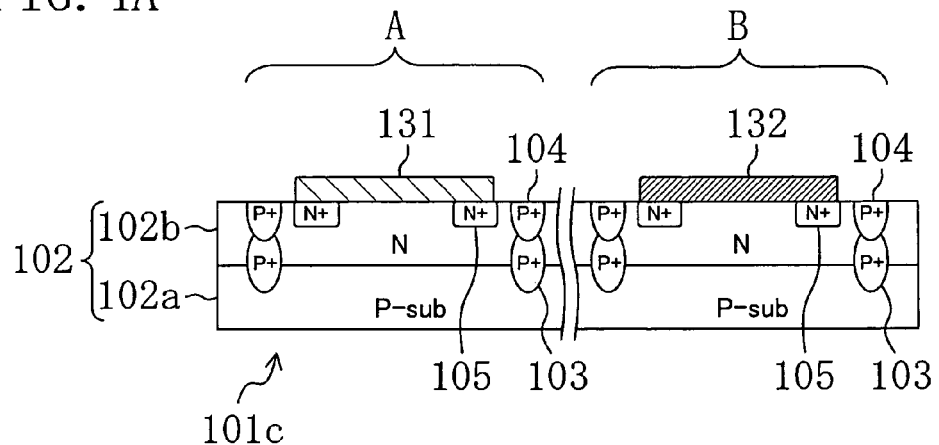
FIG. 4A is a view illustrating the structure of an optical semiconductor device 101c according to a third embodiment and FIG. 4B is a graph illustrating the reflectance spectra of a first light receiving region A and a second light receiving region B of the optical semiconductor device 101c.

FIG. 4A is a schematic view illustrating the sectional structure of the optical semiconductor device 101c. Some of the components of the optical semiconductor device 101c are common with those of the optical semiconductor device 101a of the first embodiment shown in FIG. 2A. Therefore, in FIG. 4A, such components are indicated by the same reference numerals as used in FIG. 2A to omit detailed explanation. A detailed explanation of a characteristic part of the optical semiconductor device 101c of the present embodiment will be provided below.

In the optical semiconductor device 101c, a first anti-reflection film 131 and a second anti-reflection film 132 are formed in the first light receiving region A and the second light receiving region B, respectively. Both of the first and second anti-reflection films 131 and 132 are made of silicon nitride films of about 80 nm thick. The first anti-reflection film 131 is implanted with N-type impurities at a concentration of about $1 \times 10^{21}$ cm$^{-3}$ to have a higher refractive index than that of the second anti-reflection film 132 which is not implanted with the impurities.

Specifically, the first anti-reflection film 131 made of the silicon nitride film implanted with the impurities has a refractive index of 2.25, while the second anti-reflection film 132 made of the silicon nitride film implanted with no impurities has a refractive index of 2.00. In the present embodiment, light is incident on each of the light receiving regions through an air layer having a refractive index of 1.00.

Figure 4B:
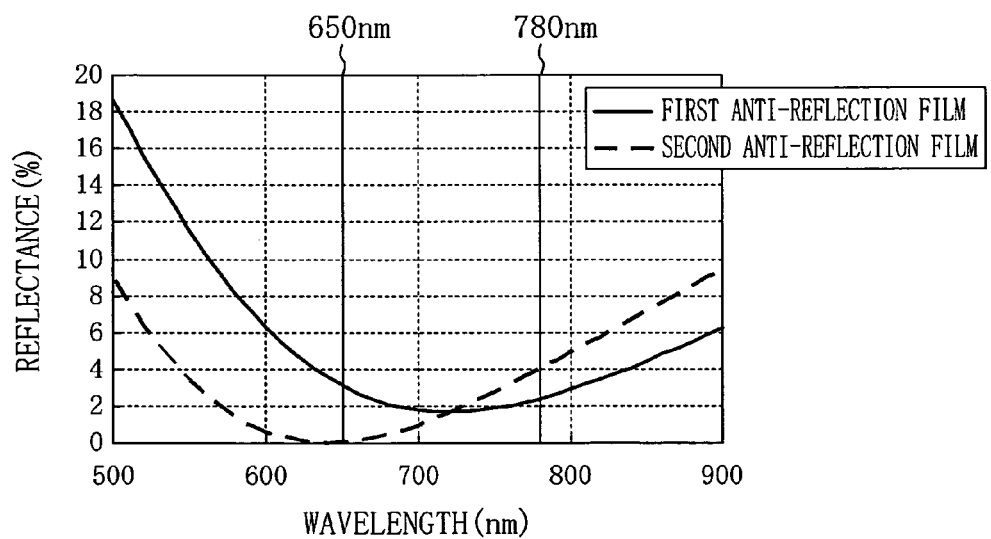

As a result, the first and second anti-reflection films 131 and 132 have different reflectance spectra as shown in FIG. 4B.

For light of 780 nm wavelength, the first anti-reflection film 131 of the first light receiving region A shows a reflectance of about 2.4%, while the second anti-reflection film 132 of the second light receiving region B shows a reflectance of about 4.0%. For light of 650 nm wavelength, the second anti-reflection film 132 shows a reflectance of about 0.1%, while the first anti-reflection film 131 shows a reflectance of about 3.0%.

Thus, in the optical semiconductor device 101c, the first anti-reflection film 131 has a different refractive index from that of the second anti-reflection film 132 made of the same silicon nitride film. Therefore, the first and second anti-reflection films 131 and 132 show reflectance spectra different from each other. As a result, the first and second light receiving regions A and B for receiving different wavelengths of light show reduced reflectances for given wavelengths of light different from each other, respectively, thereby improving the sensitivity to light.

It may be possible to use a film other than the silicon nitride film as the anti-reflection film and implant the impurities therein. However, significant effect is obtained when the silicon nitride film is used.

The thicknesses of the anti-reflection films, the concentration of the impurities implanted into the first anti-reflection film, the wavelengths of the incident light and the reflectance spectra appeared herein are described only for explanation and the present invention is not particularly limited thereto. The first and second anti-reflection films may have different thicknesses and one of the films may be implanted with the impurities.

Fourth Embodiment

An explanation of an optical semiconductor device 101d according to a fourth embodiment of the present invention will be provided with reference to the drawings.

Figure 5A:
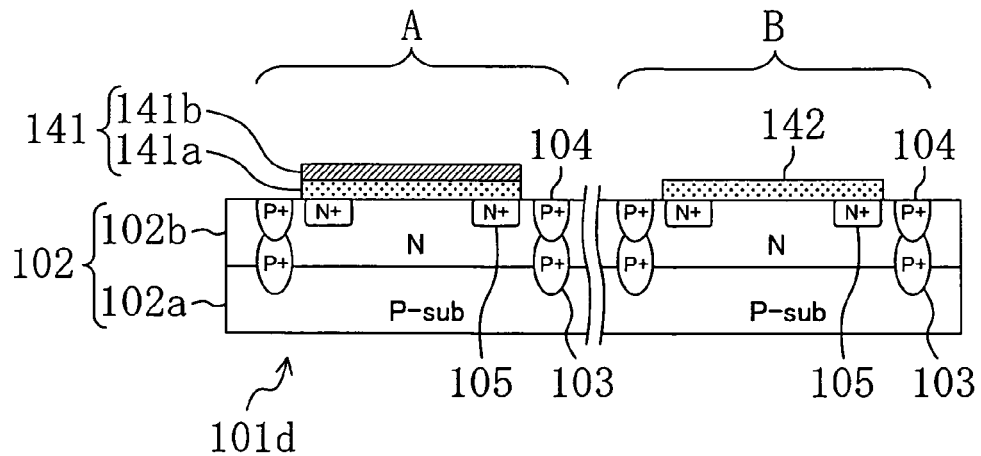
FIG. 5A is a view illustrating the structure of an optical semiconductor device 101d according to a fourth embodiment and FIG. 5B is a graph illustrating the reflectance spectra of a first light receiving region A and a second light receiving region B of the optical semiconductor device 101d.

FIG. 5A is a schematic view illustrating the sectional structure of the optical semiconductor device 101d. Some of the components of the optical semiconductor device 101d are common with those of the optical semiconductor device 101a of the first embodiment shown in FIG. 2A. Therefore, in FIG. 5A, such components are indicated by the same reference numerals as used in FIG. 2A to omit detailed explanation. A detailed explanation of a characteristic part of the optical semiconductor device 101d of the present embodiment will be provided below.

In the first light receiving region A of the optical semiconductor device 101d, a silicon oxide film 141a of about 110 nm thick is formed and a silicon nitride film 141b of about 80 nm thick is formed thereon to provide a two-layered first anti-reflection film 141. In a second light receiving region B, a second anti-reflection film 142 made of a silicon oxide film of about 110 nm thick is formed.

Specifically, in the optical semiconductor device 101d, the first anti-reflection film 141 includes the silicon nitride film 141b formed on the silicon oxide film 141a which is the same as the second anti-reflection film 142. Specifically, the first and second anti-reflection films 141 and 142 have different layer structures.

In the present embodiment, light is incident on the light receiving regions through an air layer. The air has a refractive index of 1.00, the silicon oxide film has 1.45 and the silicon nitride film has 2.04.

Figure 5B:
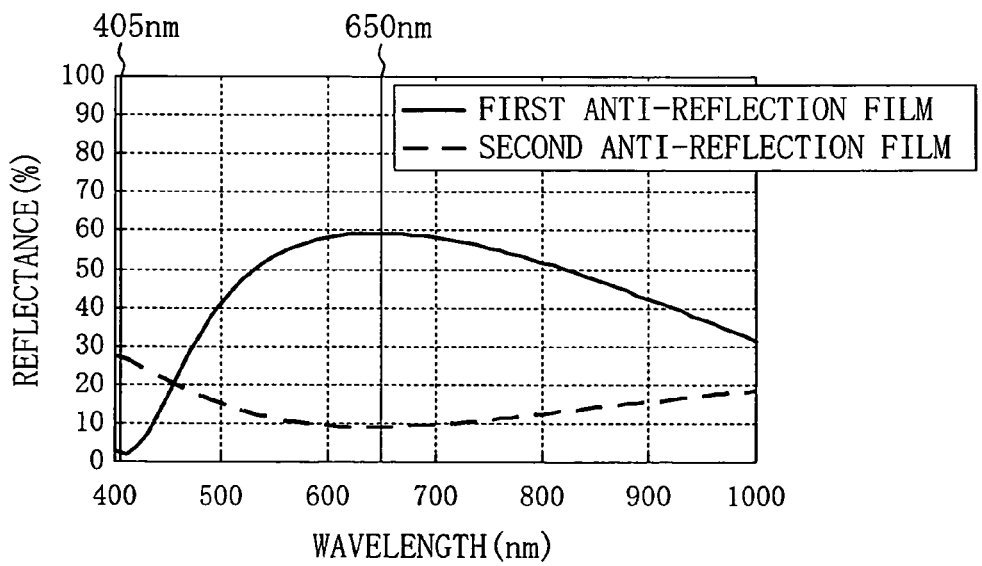

Under the above-described conditions, the first and second anti-reflection films 141 and 142 show the reflectance spectra as shown in FIG. 5B.

For light of 405 nm wavelength, the first anti-reflection film 141 of the first light receiving region A shows a reflectance of about 2%, while the second anti-reflection film 142 of the second light receiving region B shows a reflectance over 25%.

For light of 650 nm wavelength, the second anti-reflection film 142 shows a reflectance of about 9%, while the first anti-reflection film 141 shows a reflectance of about 60%.

Thus, in the optical semiconductor device 101d, the first and second anti-reflection films 141 and 142 have different layer structures. Therefore, the first and second light receiving regions A and B for receiving different wavelengths of light show reduced reflectances for given wavelengths of light different from each other, respectively, thereby improving the sensitivity to light.

In particular for short wavelength light (405 nm) to which the sensitivity is significantly low, the two-layered anti-reflection film (first anti-reflection film 141) is effectively used because it reduces the reflectance to a further extent.

In the present embodiment, the two-layered first anti-reflection film 141 and the single-layered second anti-reflection film 142 are used. However, the present invention is not limited thereto as long as the first and second anti-reflection films 141 and 142 have different layer structures. For example, the first anti-reflection film 141 may be a three-layered film further including a film of other material on the silicon nitride film 141b. The thicknesses and materials of the films appeared herein are described only for explanation. Changing the thicknesses or materials of the anti-reflection films makes it possible to reduce the reflectances for given wavelengths of light different from each other, respectively, thereby improving the sensitivity to light.

Fifth Embodiment

An explanation of an optical semiconductor device 101e according to a fifth embodiment of the present invention will be provided.

Figure 6A:
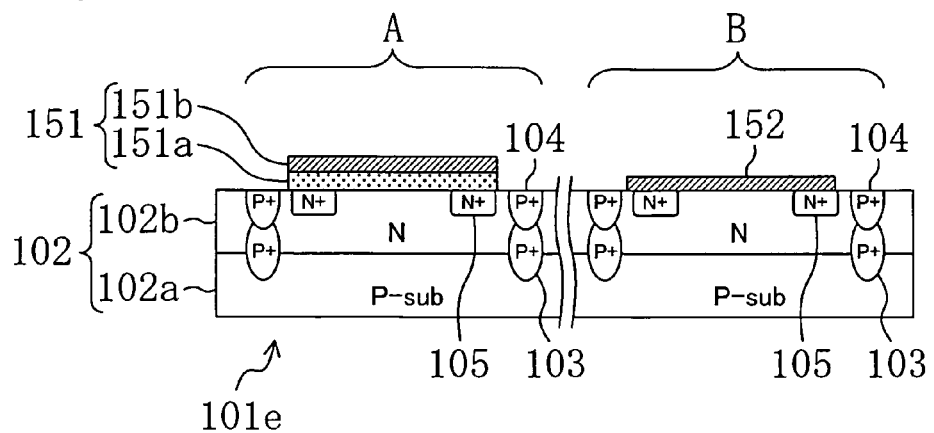
FIG. 6A is a view illustrating the structure of an optical semiconductor device 101e according to a fifth embodiment and FIG. 6B is a graph illustrating the reflectance spectra of a first light receiving region A and a second light receiving region B of the optical semiconductor device 101e.

FIG. 6A is a schematic view illustrating the sectional structure of the optical semiconductor device 101e. Some of the components of the optical semiconductor device 101e are common with those of the optical semiconductor device 101a of the first embodiment shown in FIG. 2A. Therefore, in FIG. 6A, such components are indicated by the same reference numerals as used in FIG. 2A to omit detailed explanation. A detailed explanation of a characteristic part of the optical semiconductor device 101e of the present embodiment will be provided below.

In the first light receiving region A of the optical semiconductor device 101e, a silicon oxide film 151a of about 110 nm thick is formed and a silicon nitride film 151b of about 80 nm thick is formed thereon to provide a two-layered first anti-reflection film 151. In the second light receiving region B, a second anti-reflection film 152 made of a silicon nitride film of about 80 nm thick is formed.

Specifically, in the optical semiconductor device 101e, the first anti-reflection film 151 includes the silicon oxide film 151a and the silicon nitride film 151b which is formed on the silicon oxide film 151a and the same as the second anti-reflection film 152. As a result, the first and second anti-reflection films 151 and 152 have different layer structures.

In the present embodiment, light is incident on the light receiving regions through an air layer. The air has a refractive index of 1.00, the silicon oxide film has 1.45 and the silicon nitride film has 2.04.

Figure 6B:
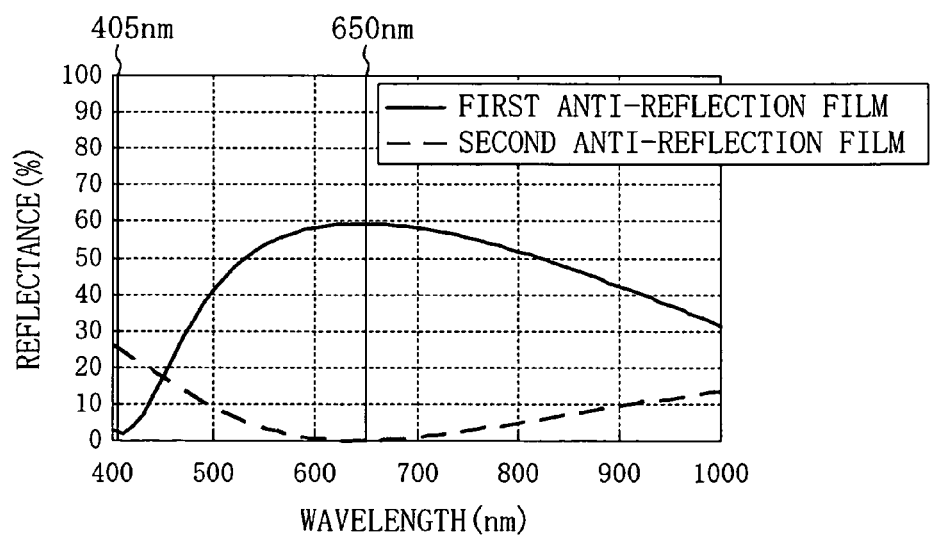

Under the above-described conditions, the first and second anti-reflection films 151 and 152 show the reflectance spectra as shown in FIG. 6B.

For light of 405 nm wavelength, the first anti-reflection film 151 of the first light receiving region A shows a reflectance of about 2%, while the second anti-reflection film 152 of the second light receiving region B shows a reflectance over 25%.

For light of 650 nm wavelength, the second anti-reflection film 152 shows a reflectance of about 0.5%, while the first anti-reflection film 151 shows a reflectance of about 60%.

Thus, in the optical semiconductor device 101e, the first and second anti-reflection films 151 and 152 have different layer structures. Therefore, the first and second light receiving regions A and B for receiving different wavelengths of light show reduced reflectances for given wavelengths of light different from each other, respectively, thereby improving the sensitivity to light. Further, as the second anti-reflection film 152 is made of the silicon nitride film which is capable of reducing the reflectance more than the silicon oxide film, the sensitivity of the light receiving regions to light improves to a further degree as compared with the fourth embodiment.

Also in the present embodiment, the layer structures of the anti-reflection films such as the number, thicknesses and materials of the stacked films may be changed such that the light receiving regions show reduced reflectances for given wavelengths of light different from each other, respectively, thereby improving the sensitivity to light.

(Embodiments of a Method for Manufacturing the Optical Semiconductor Device)

In the following embodiments, an explanation of a method for manufacturing the optical semiconductor device of the present invention will be provided with reference to the drawings. The steps of forming contacts and the following steps of forming metal wires and interlayer insulating films are omitted.

Sixth Embodiment

An explanation of a method for manufacturing an optical semiconductor device according to a sixth embodiment will be provided. In the optical semiconductor device obtained in the present embodiment, a three-layered anti-reflection film is formed in a first light receiving region A and a single-layered anti-reflection film is formed in a second light receiving region B.

Figure 7A:
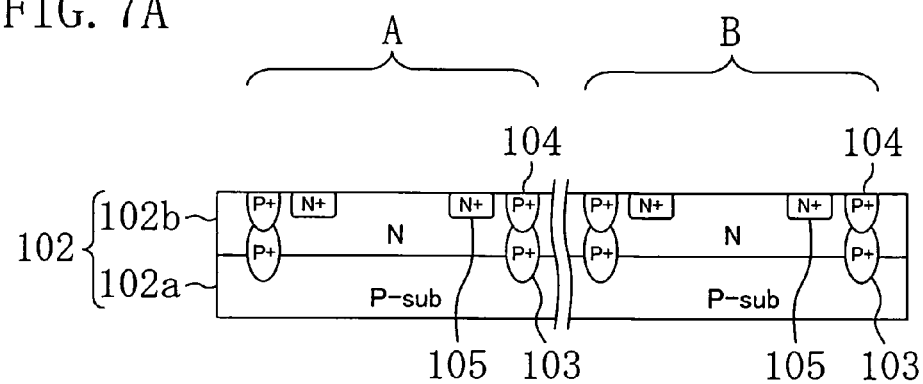
FIGS. 7A to 7C are views illustrating the steps of a method for manufacturing an optical semiconductor device according to a sixth embodiment.
Figure 7B:
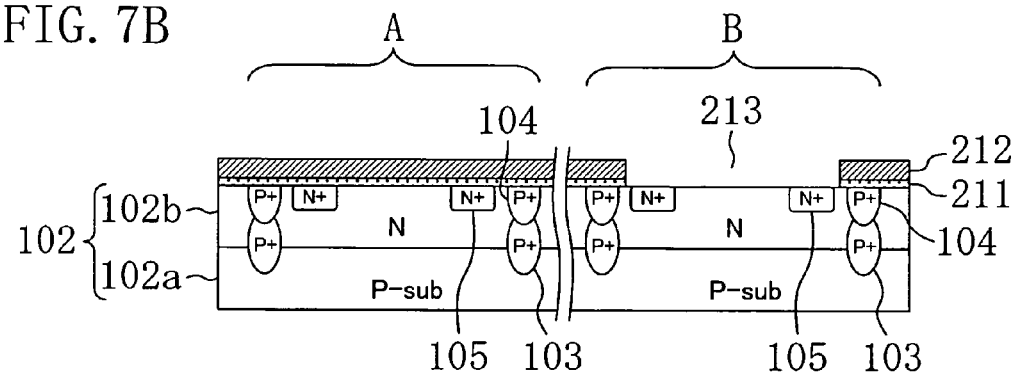
Figure 7C:
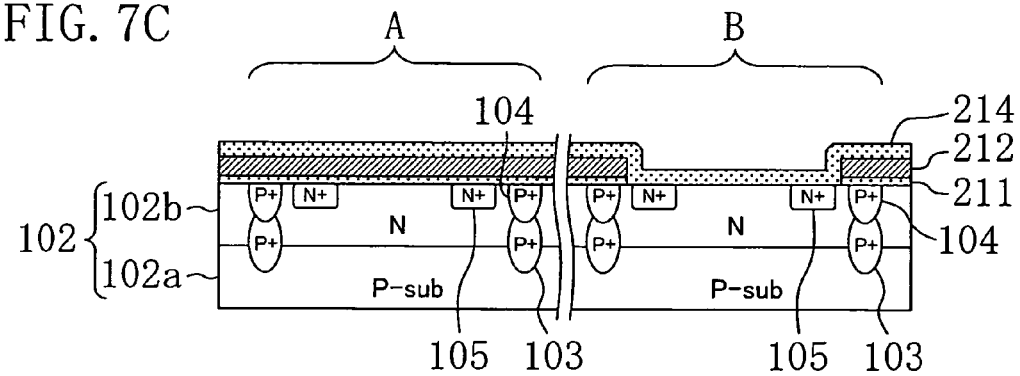

FIGS. 7A to 7C illustrate the steps of the method for manufacturing an optical semiconductor device according to the sixth embodiment.

Referring to FIG. 7A, a first light receiving region A and a second light receiving region B including light receiving elements, respectively, are provided in different positions of a substrate 102. In order to obtain this structure, first, an N-type epitaxial layer 102b is formed on a P-type Si substrate 102a by a known epitaxy technique to prepare a substrate 102. Then, lithography, etching and ion implantation are performed to form a P$^+$-type buried layer 103, a P$^+$-type diffusion layer 104 and an N$^+$-type diffusion layer 105, thereby providing a first light receiving region A and a second light receiving region B. More specifically, the P$^+$-type buried layer 103 is formed near the interface between the P-type Si substrate 102a and the N-type epitaxial layer 102b by implanting P-type impurities at a concentration of about $1 \times 10^{19}$ cm$^{-3}$. The P$^+$-type diffusion layer 104 is formed by implanting P-type impurities at a concentration of about $5 \times 10^{20}$ cm$^{-3}$ in part of the substrate 102 above the P$^+$-type buried layer 103. The N$^+$-type diffusion layer 105 is formed by implanting N-type impurities at a concentration of about $5 \times 10^{20}$ cm$^{-3}$ in the surface of the N-type epitaxial layer 102b. The N-type epitaxial layer 102b has an N-type impurity concentration of about $1 \times 10^{16}$ cm$^{-3}$. However, these concentrations are not limitative.

The P$^+$-type diffusion layer 104 functions as an anode lead and the N$^+$-type diffusion layer 105 functions as a cathode lead.

Then, as shown in FIG. 7B, a first silicon oxide film 211 is formed on the substrate 102 by thermal oxidation as a first layer of a first insulating film. Then, a silicon nitride film 212 is formed on the first silicon oxide film 211 by low pressure CVD (Chemical Vapor Deposition) as a second layer of the first insulating film. As the low pressure CVD is used, the silicon nitride film 212 is formed with improved uniformity in thickness, thereby reducing variations in the sensitivity of the light receiving element to light.

Then, in the second light receiving region B, the silicon oxide film 211 and the silicon nitride film 212 as the first insulating film are selectively removed by dry etching to form an opening 213.

Then, as shown in FIG. 7C, a second silicon oxide film 214 is formed on the substrate 102 by CVD as a second insulating film. Specifically, the second silicon oxide film 214 is formed over the silicon nitride film 212 in the first light receiving region A and on the surface of the substrate 102 (N-type epitaxial layer 102b) exposed in the opening 213 in the second light receiving region B.

Through the above-described steps, anti-reflection films of different layer structures are formed in the two light receiving regions A and B. Specifically, in the first light receiving region A, the first silicon oxide film 211, the silicon nitride film 212 and the second silicon oxide film 214 are stacked in this order from the bottom to provide a three-layered first anti-reflection film. In the second light receiving region B, the second silicon oxide film 214 is formed as a second anti-reflection film.

As a specific example, suppose that light is incident on the light receiving regions A and B through an air layer and the first silicon oxide film 211 of 10 nm thick, the silicon nitride film 212 of 50 nm thick and the second silicon oxide film 214 of 110 nm are formed. Under these conditions, the first light receiving region A shows a reflectance of 0.2% for light of 405 nm wavelength and 11% for light of 650 nm wavelength. The second light receiving region B shows a reflectance of 27% for the light of 405 nm wavelength and 9% for the light of 650 nm wavelength.

According to the method for manufacturing the optical semiconductor device of the present embodiment, the first light receiving region A has a reduced reflectance for the light of 405 nm wavelength to improve the sensitivity to the light. Further, the second light receiving region B has a reduced reflectance for the light of 650 nm wavelength to improve the sensitivity to the light. In other words, the first and second light receiving regions A and B improve in sensitivity to given wavelengths of light, respectively, as compared with the first and second light receiving regions A and B including the anti-reflection films of the same structure.

As described above, according to the method for manufacturing the optical semiconductor device of the present embodiment, a plurality of light receiving regions for receiving light of different wavelengths are provided on a single substrate 102 such that each of the light receiving regions shows improved sensitivity to light.

In the optical semiconductor device of the present embodiment, the first silicon oxide film 211 has the effect of reducing stress applied to the interface between the N-type epitaxial layer 102b of the substrate 102 and the silicon nitride film 212 and reducing recombination according to the interface state. As a result, the sensitivity of the light receiving regions to light is effectively prevented from reduction. In particular, if short wavelength light (e.g., 405 nm) is absorbed near the interface with the outside because its absorption coefficient is high, thereby generating a large amount of carriers. That is, the short wavelength light is highly dependent on the interface. Therefore, for the short wavelength light, the reduction of the stress is significantly effective.

Seventh Embodiment

An explanation of a method for manufacturing an optical semiconductor device according to a seventh embodiment of the present invention will be provided. In the optical semiconductor device of the present embodiment, a three-layered anti-reflection film is formed in the first light receiving region A and a two-layered anti-reflection film is formed in the second light receiving region B.

In the same manner as described in the sixth embodiment, the structure shown in FIG. 7A is provided. Specifically, a $P^+$-type buried layer 103, a $P^+$-type diffusion layer 104 and an $N^+$-type diffusion layer 105 are formed in a substrate 102.

Figure 8A:
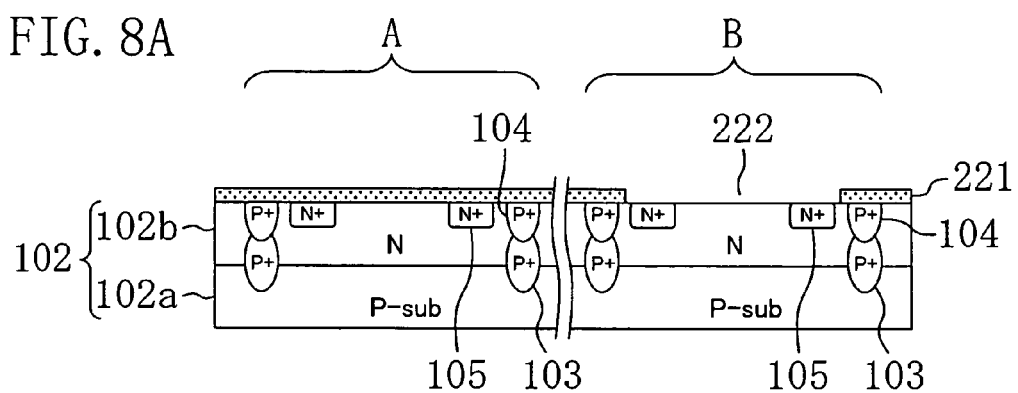
FIGS. 8A to 8B are views illustrating the steps of a method for manufacturing an optical semiconductor device according to a seventh embodiment.
Figure 8B:
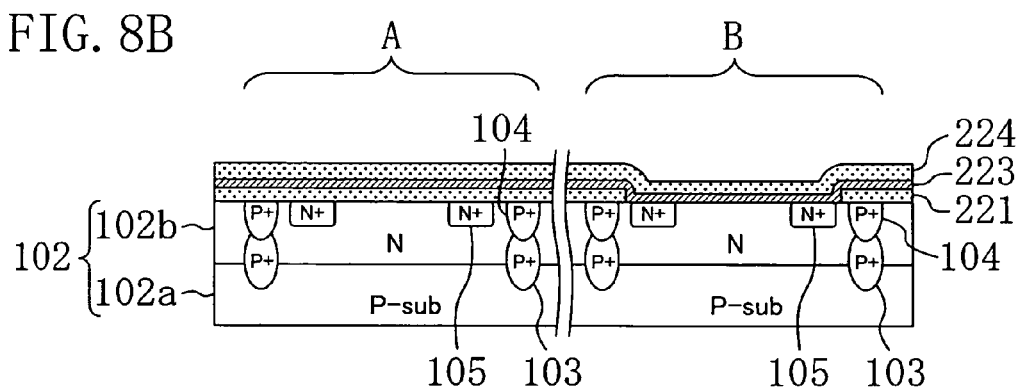

Then, anti-reflection films are formed in the first and second light receiving regions A and B of the substrate 102, respectively. FIGS. 8A and 8B show the steps of forming the anti-reflection films according to the present embodiment.

First, as shown in FIG. 8A, a first silicon oxide film 221 is formed over the first and second light receiving regions A and B of the substrate 102 by CVD as a first insulating film. Then, part of the first silicon oxide film 211 in the second light receiving region B is selectively removed by wet etching using an etchant based on hydrogen fluoride to form an opening 222.

Then, as shown in FIG. 8B, a silicon nitride film 223 is formed on the substrate 102 by low pressure CVD as a first layer of a second insulating film. The silicon nitride film 223 is formed on the silicon oxide film 221 in the first light receiving region A and on the surface of the substrate 102 (N-type epitaxial layer 102b) exposed in the opening 222 in the second light receiving region B. Then, a second silicon oxide film 224 is formed on the silicon nitride film 223 as a second layer of the second insulating film.

Through the above-described steps, anti-reflection films having different layer structures are formed in the two light receiving regions A and B, respectively. Specifically, in the first light receiving region A, the first silicon oxide film 221, the silicon nitride film 223 and the second silicon oxide film 224 are stacked in this order from the bottom to provide a three-layered first anti-reflection film. In the second light receiving region B, the silicon nitride film 223 and the second silicon oxide film 224 are stacked in this order from the bottom to provide a two-layered second anti-reflection film.

As a specific example, suppose that light is incident on the light receiving regions through a resin layer having substantially the same refractive index (1.50) as that of the silicon oxide film and the first silicon oxide film 221 and the silicon nitride film 223 are 80 nm in thickness, respectively. As the second silicon oxide film 224 has substantially the same refractive index as that of the resin layer, the thickness thereof does not have any effect on the reflectance.

Under these conditions, the first receiving region A shows a reflectance of 0.2% for light of 405 nm wavelength and 11% for light of 650 nm wavelength. The second light receiving region B shows a reflectance of 16% for the light of 405 nm wavelength and 2.4% for the light of 650 nm wavelength.

Thus, the three-layered anti-reflection film is formed in the first light receiving region A and the two-layered anti-reflection film is formed in the second light receiving region B such that the anti-reflection films show reduced reflectances for light of given wavelengths of light different from each other, respectively. Therefore, the optical semiconductor device is provided with the light receiving regions which are formed on the single substrate 102 and show improved sensitivities to the wavelengths of light different from each other, respectively.

In the present embodiment, as the air enters the optical semiconductor device through a resin layer, there is no correlation between the thickness of the second silicon oxide film 224 and the reflectances of the light receiving regions. Therefore, the second silicon oxide film 224 may be formed thicker to function also as an interlayer insulating film.

Eighth Embodiment

An explanation of a method for manufacturing an optical semiconductor device according to an eighth embodiment of the present invention will be provided. In the optical semiconductor device of the present embodiment, an impurity region is formed in the surface of the first light receiving region A of the substrate 102 just like in the optical semiconductor device of the second embodiment shown in FIG. 3A such that thermal oxide films of different thicknesses are formed.

In the same manner as described in the sixth embodiment, the structure shown in FIG. 7A is provided. Specifically, a $P^+$-type buried layer 103, a $P^+$-type diffusion layer 104 and an $N^+$-type diffusion layer 105 are formed in a substrate 102.

Figure 9A:
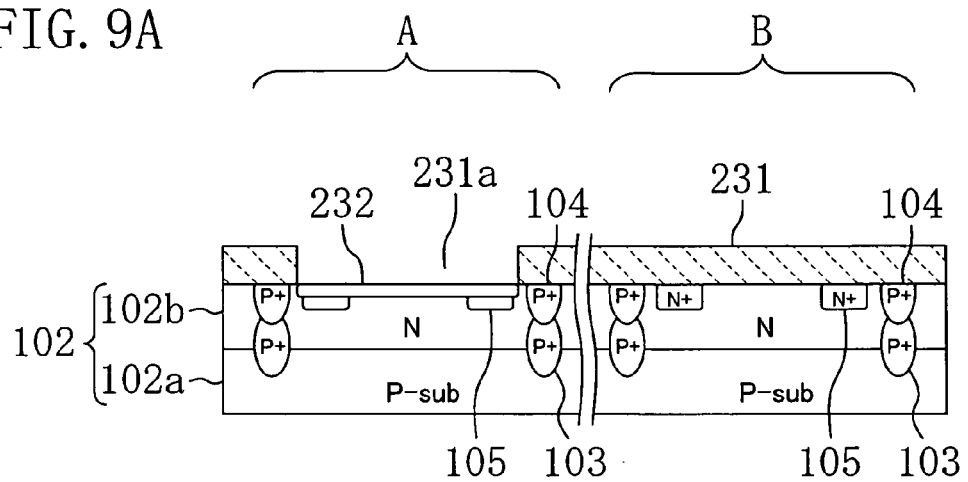
FIGS. 9A to 9B are views illustrating the steps of a method for manufacturing an optical semiconductor device according to an eighth embodiment.
Figure 9B:
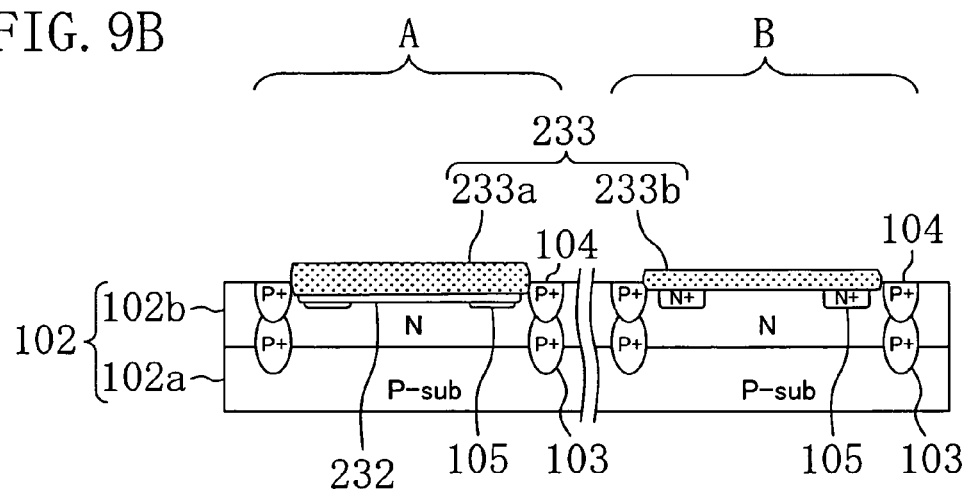

Then, anti-reflection films are formed in the first and second light receiving regions A and B, respectively. FIGS. 9A and 9B illustrate the steps of forming the anti-reflection films according to the present embodiment.

As shown in FIG. 9A, a photoresist 231 having an opening 231a in the first light receiving region A is formed on the substrate 102 by known photolithography. Using the photoresist 231 as a mask, impurities are introduced into part of the surface of the N-type epitaxial layer 102b in the first light receiving region A. For example, P (phosphorus) is implanted at implantation energy of 40 keV and a concentration of $1 \times 10^{15}$ cm$^{-2}$. After the ion implantation, thermal treatment is carried out to diffuse the implanted impurities to form an $N^+$-type high concentration impurity region 232 having an impurity concentration of about $1 \times 10^{20}$ cm$^{-3}$.

Then, the photoresist 231 is removed.

Subsequently, the entire surface of the substrate 102 is thermally oxidized by dry oxidation at 1000° C. to form a silicon oxide film. Then, the silicon oxide film is etched using an etchant based on hydrogen fluoride to remove unwanted part of the silicon oxide film. As a result, a silicon oxide film 233 is provided on the surface of the N-type epitaxial layer 102b. As the high concentration impurity region 232 has been formed, a thermal oxide film 233a grows faster in the first light receiving region A and becomes thicker than a thermal oxide film 233b formed in the second light receiving region B. For example, the thermal oxide film 233a may be 140 nm thick and the thermal oxide film 233b may be 70 nm thick. In this manner, the structure shown in FIG. 9B is obtained. This is the same structure as the one described in the second embodiment.

Through the above-described steps, the thermal oxide films 233a and 233b having different thicknesses are formed by single thermal oxidation. Therefore, the manufacturing steps are simplified as compared with the case where the thermal oxide films of different thicknesses are formed by separate thermal oxidations.

Thus, in the first and second light receiving regions A and B on the single substrate 102, the anti-reflection films having different thicknesses and therefore having different reflectance spectra are formed, respectively. The light receiving regions are optimized for given wavelengths of light different from each other, respectively.

Ninth Embodiment

An explanation of a method for manufacturing an optical semiconductor device according to a ninth embodiment of the present invention will be provided. In the optical semiconductor device of the present embodiment, anti-reflection films made of the same material are formed in the first and second light receiving regions A and B and only the anti-reflection film in the first light receiving region A is implanted with impurities.

In the same manner as described in the sixth embodiment, the structure shown in FIG. 7A is provided. Specifically, a $P^+$-type buried layer 103, a $P^+$-type diffusion layer 104 and an $N^+$-type diffusion layer 105 are formed in a substrate 102.

Figure 10A:
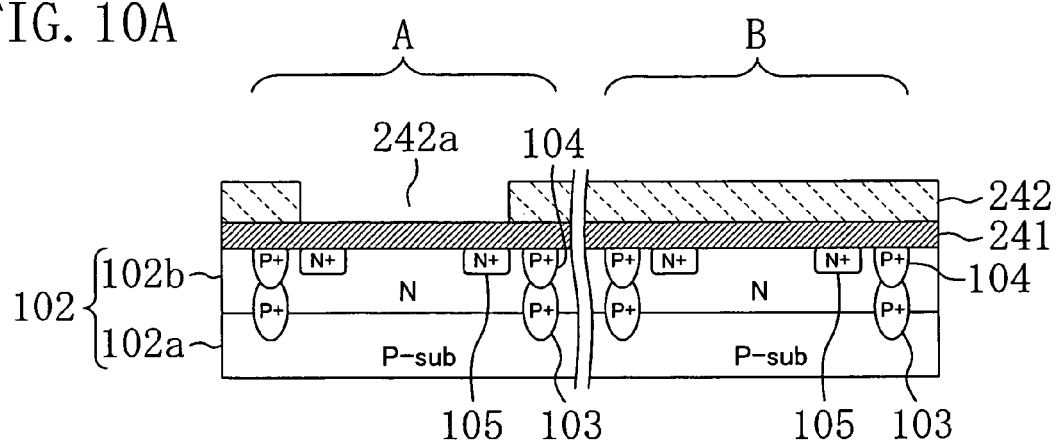
FIGS. 10A to 10B are views illustrating the steps of a method for manufacturing an optical semiconductor device according to a ninth embodiment.
Figure 10B:
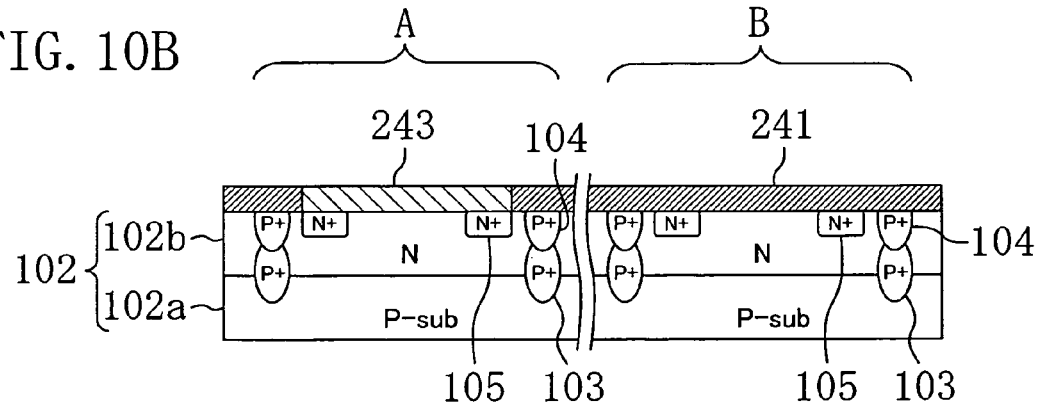

Then, anti-reflection films are formed in the first and second light receiving regions A and B, respectively. FIGS. 10A and 10B illustrate the steps of forming the anti-reflection films according to the present embodiment.

As shown in FIG. 10A, a silicon nitride film 241 is formed over the first and second light receiving regions A and B of the substrate 102 by low pressure CVD. Then, a photoresist 242 having an opening 242a in the first light receiving region A is formed on the silicon nitride film 241 by known photolithography. The silicon nitride film 241 is 50 nm thick, for example.

Then, as shown in FIG. 10B, using the photoresist 242 as a mask, N-type impurities are introduced in part of the surface of the N-type epitaxial layer 102b exposed in the opening 242a in the first light receiving region A. Specifically, As (arsenic) is introduced by ion implantation at implantation energy of 10 keV and a concentration of $1 \times 10^{16}$ cm$^{-2}$. Then, the photoresist 242 is removed.

An impurity-implanted silicon nitride film 243 in the first light receiving region A has a higher refractive index than that of the silicon nitride film 241 in the second light receiving region B which is not implanted with the impurities. Specifically, the refractive index of the impurity-implanted silicon nitride film 243 is 2.25, while that of the silicon nitride film 241 is 2.00.

Thus, the anti-reflection films formed in the first and second light receiving regions A and B have different refractive indices and therefore show different reflectance spectra. In the present embodiment, the reflectances of the anti-reflection films are adjusted by impurity implantation into part of a single film. Thus, the light receiving regions formed on the single substrate 102 are optimized for given wavelengths of light different from each other, respectively.

Tenth Embodiment

An explanation of a method for manufacturing an optical semiconductor device according to a tenth embodiment of the present invention will be provided. In the optical semiconductor device of the present embodiment, a two-layered anti-reflection film is formed in the first light receiving region A and a single-layered anti-reflection film is formed in the second light receiving region B just like in the optical semiconductor device of the fourth embodiment shown in FIG. 5A.

In the same manner as described in the sixth embodiment, the structure shown in FIG. 7A is provided. Specifically, a $P^+$-type buried layer 103, a $P^+$-type diffusion layer 104 and an $N^+$-type diffusion layer 105 are formed in a substrate 102.

Figure 11A:
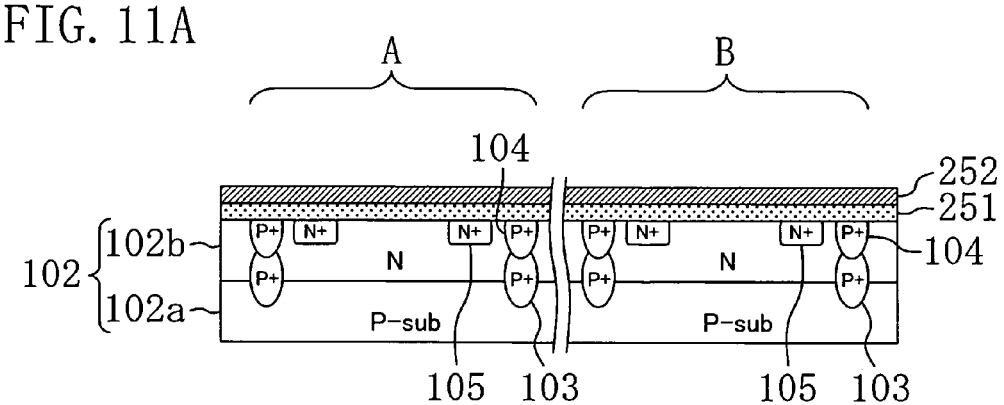
FIGS. 11A to 11B are views illustrating the steps of a method for manufacturing an optical semiconductor device according to a tenth embodiment.
Figure 11B:
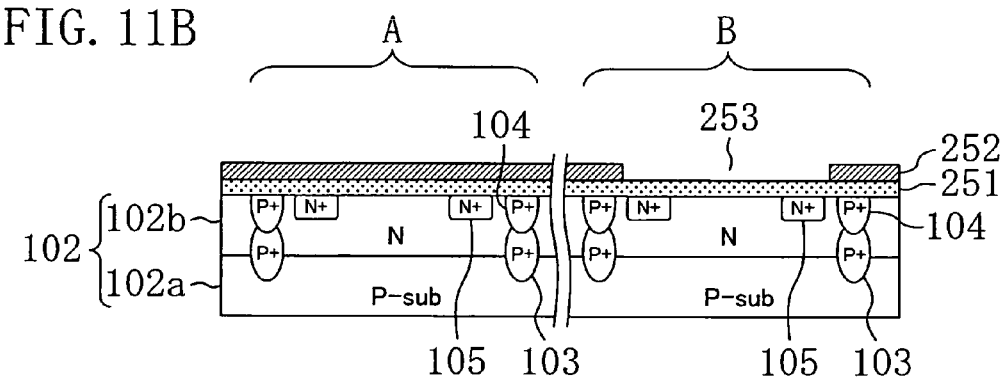

Then, anti-reflection films are formed in the first and second light receiving regions A and B, respectively. FIGS. 11A and 11B illustrate the steps of forming the anti-reflection films according to the present embodiment.

As shown in FIG. 11A, a silicon oxide film 251 is formed over the first and second light receiving regions A and B of the substrate 102 by CVD. The silicon oxide film 251 is a first layer of the two-layered anti-reflection film in the first light receiving region A and also functions as the single-layered anti-reflection film by itself in the second light receiving region B.

Then, a silicon nitride film 252 is formed on the silicon oxide film 251 by low pressure CVD.

Then, as shown in FIG. 11B, using the silicon oxide film 251 as an etch stopper, part of the silicon nitride film 252 in the second light receiving region B is selectively removed to form an opening 253 by wet etching using hot phosphoric acid. If hot phosphoric acid is used as an etchant, the silicon nitride film 252 is removed with high selectivity because the silicon nitride film is etched by hot phosphoric acid 4 or 5 times faster than the silicon oxide film.

Through the above-described steps, the two-layered anti-reflection film is provided in the first light receiving region A by forming the silicon nitride film 252 on the silicon oxide film 251 and the single-layered anti-reflection film made of the silicon oxide film 251 is provided in the second light receiving region B. For example, the silicon oxide film 251 may be 110 nm thick and the silicon nitride film 252 may be 160 nm thick.

Thus, due to the anti-reflection films having different structures, the first and second light receiving regions A and B are given with different reflectance spectra. As a result, the light receiving regions are optimized to show improved sensitivities to given wavelengths of light different from each other, respectively. Further, such a structure is achieved on the single substrate 102.

Eleventh Embodiment

An explanation of a method for manufacturing an optical semiconductor device according to an eleventh embodiment of the present invention will be provided. In the present embodiment, single-layered anti-reflection films made of different materials are formed in two light receiving regions, respectively, just like in the optical semiconductor device of the first embodiment shown in FIG. 2A.

In the same manner as described in the sixth embodiment, the structure shown in FIG. 7A is provided. Specifically, a P$^+$-type buried layer 103, a P$^+$-type diffusion layer 104 and an N$^+$-type diffusion layer 105 are formed in a substrate 102.

Figure 12A:
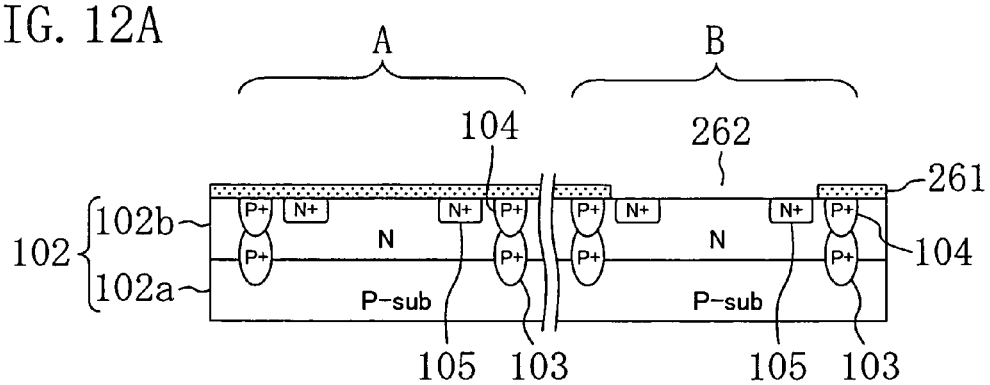
FIGS. 12A to 12C are views illustrating the steps of a method for manufacturing an optical semiconductor device according to an eleventh embodiment.

Then, anti-reflection films are formed in the first and second light receiving regions A and B, respectively. FIGS. 12A and 12C illustrate the steps of forming the anti-reflection films according to the present embodiment.

As shown in FIG. 12A, a silicon oxide film 261 is formed over the first and second light receiving regions A and B of the substrate 102 by CVD. Then, part of the silicon oxide film 261 in the second light receiving region B is selectively removed by wet etching using an etchant based on hydrogen fluoride to form a first opening 262.

Figure 12B:
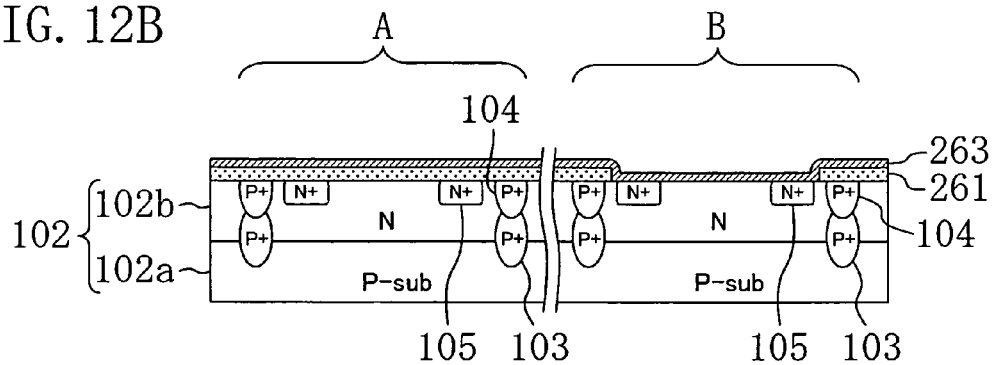
Figure 12C:
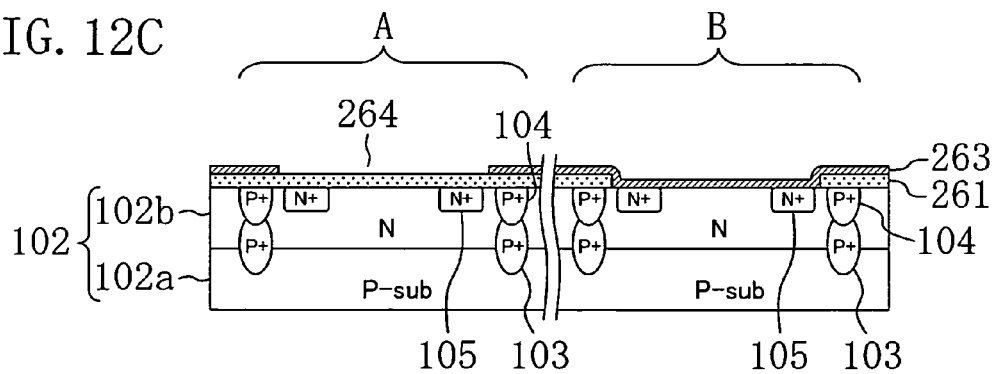

Then, as shown in FIG. 12B, a silicon nitride film 263 is formed on the silicon oxide film 261 and the surface of the substrate 102 exposed in the first opening 262 by low pressure CVD. The silicon nitride film 263 functions as an anti-reflection film in the second light receiving region B.

Then, as shown in FIG. 12C, using the silicon oxide film 261 as an etch stopper, part of the silicon nitride film 263 in the first light receiving region A is selectively removed to form a second opening 264 by wet etching using hot phosphoric acid as described in the tenth embodiment.

Through the above-described steps, an anti-reflection film made of the silicon oxide film 261 is provided in the first light receiving region A and an anti-reflection film made of the silicon nitride film 263 is provided in the second light receiving region B. Further, such a structure is achieved on the single substrate 102. For example, the silicon oxide film 261 may be 110 nm thick and the silicon nitride film 263 may be 50 nm thick.

As the anti-reflection films having different structures are formed, the first and second light receiving regions A and B are given with different reflectance spectra. Therefore, the light receiving regions are optimized to show improved sensitivities to given wavelengths of light different from each other, respectively.

The structure shown in FIG. 12B in which the silicon nitride film 263 has been formed is the same as that of the optical semiconductor device of the fifth embodiment shown in FIG. 6A. In the structure of FIG. 12B or 6A, the two light receiving regions are optimized for given wavelengths of light different from each other, respectively. Specifically, the silicon nitride film 263 is formed on the silicon oxide film 261 to provide the two-layered anti-reflection film in the first light receiving region A and the silicon nitride film 263 is formed in the second light receiving region B to function as the single-layered anti-reflection film. If the step of forming the second opening 264 by etching the silicon nitride film 263 is omitted, the optical semiconductor device shown in FIG. 6A is obtained.

Twelfth Embodiment

An explanation of a method for manufacturing an optical semiconductor device according to a twelfth embodiment of the present invention will be provided. In the optical semiconductor device of the present embodiment, two-layered anti-reflection films are formed in the first and second light receiving regions A and B, respectively, while the combinations of the stacked films are varied.

In the same manner as described in the sixth embodiment, the structure shown in FIG. 7A is provided. Specifically, a P$^+$-type buried layer 103, a P$^+$-type diffusion layer 104 and an N$^+$-type diffusion layer 105 are formed in a substrate 102.

Figure 13A:
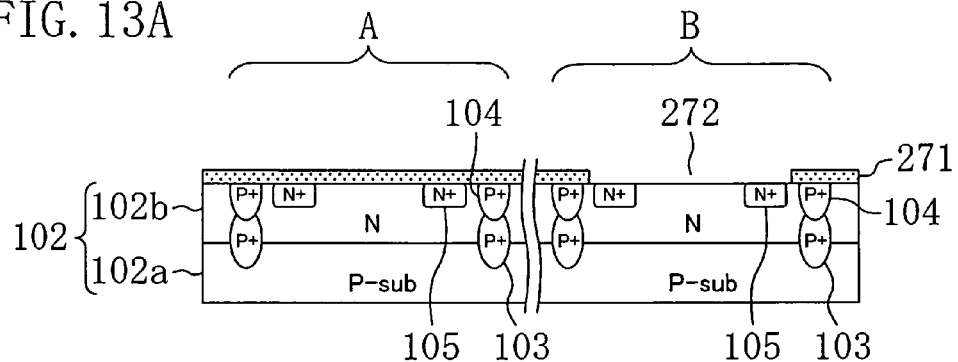
FIGS. 13A to 13C are views illustrating the steps of a method for manufacturing an optical semiconductor device according to a twelfth embodiment.

Then, anti-reflection films are formed in the first and second light receiving regions A and B, respectively. FIGS. 13A and 13C illustrate the steps of forming the anti-reflection films according to the present embodiment.

As shown in FIG. 13A, a first silicon oxide film 271 is formed over the first and second light receiving regions A and B of the substrate 102 by thermal oxidation. Then, part of the first silicon oxide film 271 in the second light receiving region B is selectively removed by wet etching using an etchant based on hydrogen fluoride to form a first opening 272.

Figure 13B:
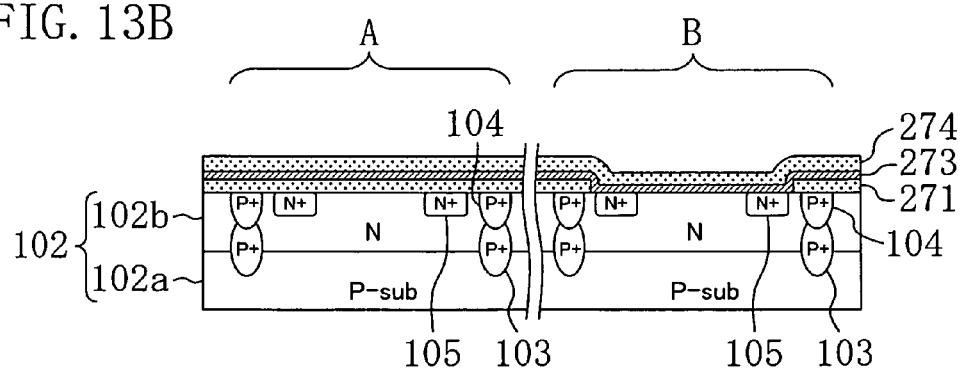
Figure 13C:
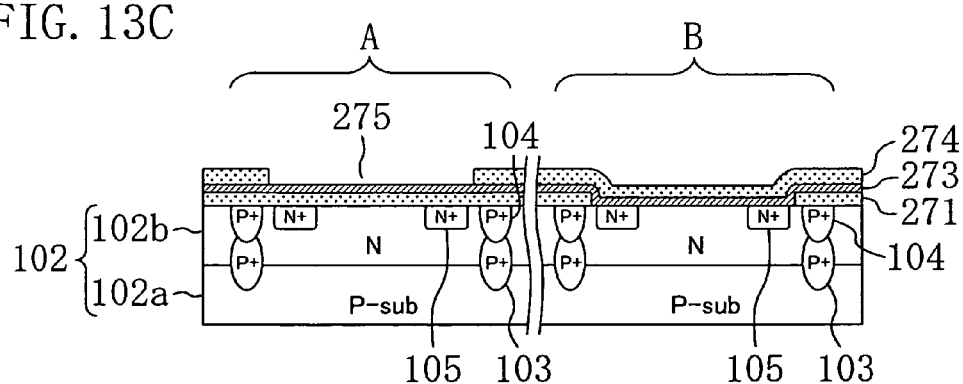
Figure 14:
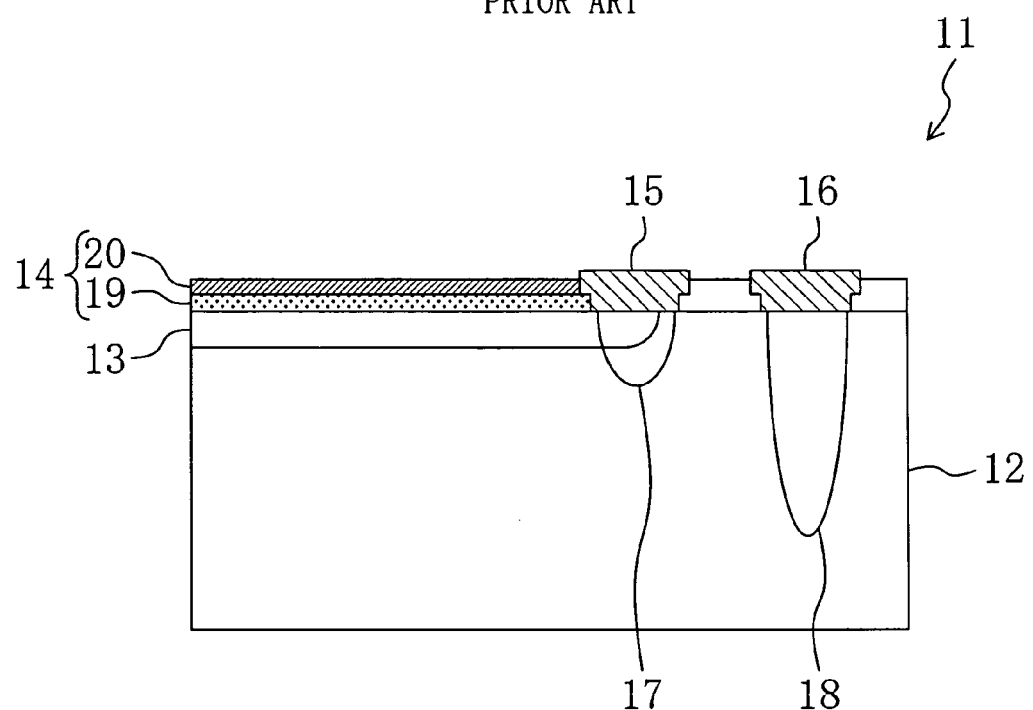
FIG. 14 is a view illustrating a conventional optical semiconductor device provided with a light receiving region including a layered anti-reflection film.
Figure 15:
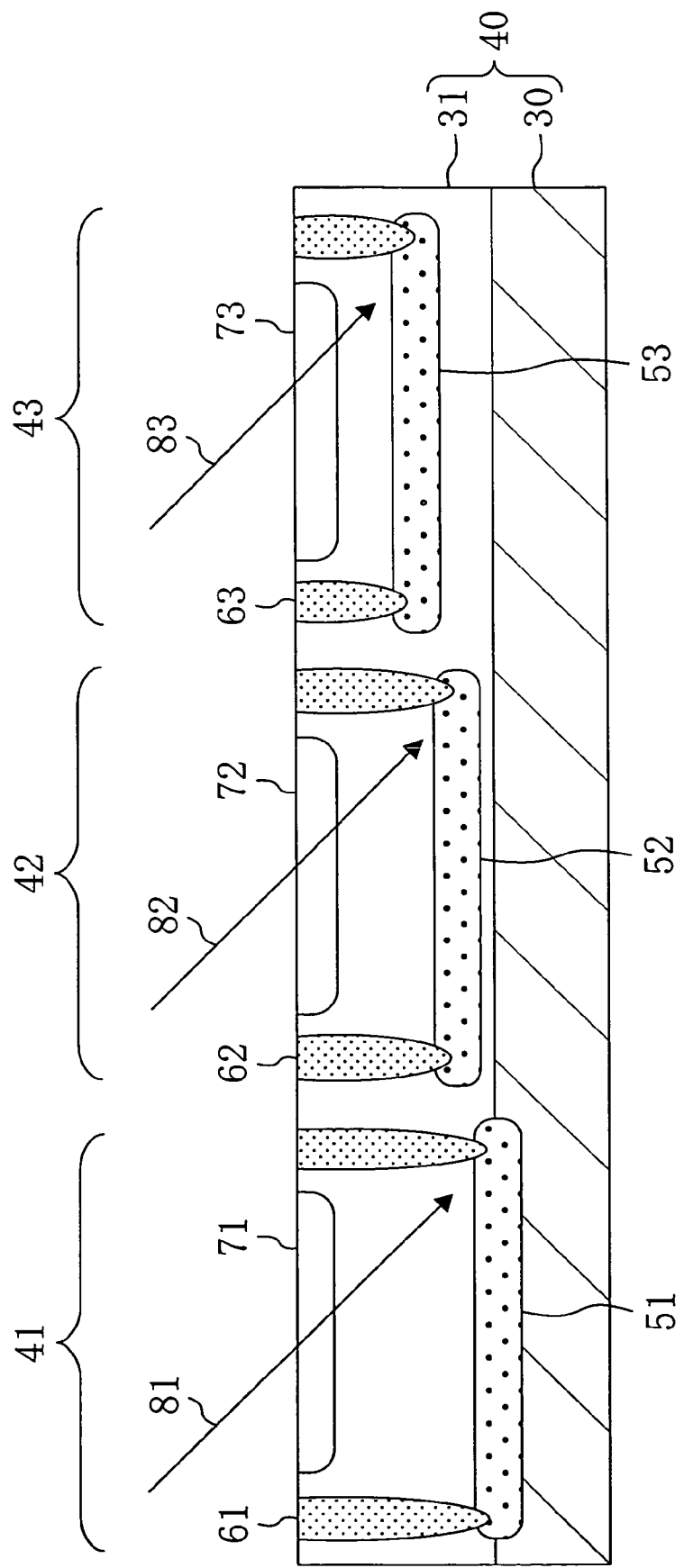
FIG. 15 is a view illustrating a conventional optical semiconductor device provided with a plurality of light receiving regions corresponding to a plurality of wavelengths of light, respectively.

Then, as shown in FIG. 13B, a silicon nitride film 273 is formed on the first silicon oxide film 271 and the surface of the substrate 102 exposed in the first opening 272 by low pressure CVD. Subsequently, a second silicon oxide film 274 is formed on the silicon nitride film 273 by CVD.

Then, as shown in FIG. 13C, using the silicon nitride film 273 as an etch stopper, part the silicon oxide film 274 in the first light receiving region A is selectively removed by wet etching using an etchant based on hydrogen fluoride to form a second opening 275.

Through the above-described steps, the silicon nitride film 273 is stacked on the first silicon oxide film 271 to provide the two-layered anti-reflection film in the first light receiving region A and the second silicon oxide film 274 is stacked on the silicon nitride film 273 to provide the two-layered anti-reflection film in the second light receiving region B. Further, the structure described above is achieved on the single substrate 102. For example, the first silicon oxide film 271 may be 10 nm thick, the silicon nitride film 273 may be 40 nm thick and the second silicon oxide film 274 may be 60 nm thick.

Even in this manner, the anti-reflection films having different structures are formed. As the first and second light receiving regions A and B have different reflectance spectra, the light receiving regions are optimized to show improved sensitivities to given wavelengths of light different from each other, respectively.

With the above-described structure, the first silicon oxide film 271 reduces stress applied to the interface between the N-type epitaxial layer 102b of the substrate 102 and the silicon nitride film 273 and prevents short wavelength light (e.g., 405 nm) from being absorbed near the surface of the substrate 102. As a result, the sensitivity to the short wavelength light becomes less likely to decrease.

Further, with the above-described structure, the reflectance of the first light receiving region A for incident light of 405 nm wavelength is 1% or less and the reflectance of the second light receiving region B for incident light of 650 nm wavelength is 1% or less. Thus, if the anti-reflection films are multilayered, the reflectances of the light receiving regions for different wavelengths of light approach zero, respectively.

In the above-described embodiments, the materials and thicknesses of the anti-reflection films and how and which material films are stacked in the anti-reflection films may be changed such that the first and second light receiving regions A and B show reduced reflectances for other wavelengths of light than those described above, respectively, thereby improving the sensitivity to light.

The above-described explanation and the drawings are directed only to the light receiving regions. However, circuit elements such as transistors, resistors and capacitors may also be formed on the same substrate. Light emitting elements, such as laser elements, may also be mounted on the same substrate.

In every embodiment described above, the optical semiconductor device is provided with two kinds of light receiving regions including the first and second light receiving regions. However, the optical semiconductor device may include three or more kinds of light receiving regions. For example, in addition to the first and second light receiving regions, a third light receiving region C may be provided. In this case, the third light receiving region C may include an anti-reflection film having a reflectance lower than the reflectances of the anti-reflection films in the first and second light receiving regions for a third wavelength range of light which is different from the first and second wavelength ranges of light. For light of the first and second wavelength ranges of light, the anti-reflection film of the third light receiving region C shows a reflectance higher than the reflectances of the anti-reflection films in the first and second light receiving regions A and B.

Such an optical semiconductor device may be an optical pickup in which the first light receiving region A corresponds to light of 780 nm wavelength for CD, the second light receiving region B corresponds to light of 650 nm wavelength for DVD and the third light receiving region C corresponds to light of 405 nm wavelength for high-density DVD.

In the above-described embodiments, the spectral bandwidth of the incident light is supposed to be as narrow as that of a laser light. However, the present invention is not limited thereto. For example, in the optical semiconductor device of the first embodiment whose reflectance spectra are shown in FIG. 2B, the first light receiving region A including the first anti-reflection film may be configured to receive light of 400 to 500 nm wavelength, while the second light receiving region B including the second anti-reflection film may be configured to receive light of 650 to 750 nm wavelength. As a result, the sensitivity improves to both wavelengths of light. Examples of such an optical semiconductor device include a CCD corresponding to incident light having a spectral bandwidth as wide as that of visible light. This is also applicable to optical semiconductor devices for camera metering, copiers and light measurement devices.

In the above-described embodiments, incident light is divided (in two as shown in FIG. 1) by a beam splitter according to the wavelength and the divided rays of light are separately incident on the light receiving regions. However, the present invention is not limited thereto. For example, the incident light is not divided and enters all the light receiving regions as it is. In this case, the anti-reflection films of the light receiving regions are configured to have reflectances different from each other for any given wavelengths of light, respectively, such that the light receiving regions themselves are capable of selecting the wavelengths, respectively. Further, in an optical pickup, signals generated from a certain light receiving region corresponding to the wavelength of the optical disk used (CD, DVD or high-density DVD) are used.

In the above-described embodiment, the light receiving regions include general PN junctions, respectively. However, the present invention is not limited thereto. For example, the present invention may be applied to PIN photodiodes, avalanche photodiodes or photoconduction devices using no PN junctions.

In the above-described embodiments, a Si substrate is used as the substrate. However, the present invention is not limited thereto. A compound semiconductor substrate or a germanium substrate may also be used as the substrate. Further, the substrate 102 includes the P-type Si substrate 102a and the N-type epitaxial layer 102b stacked thereon. However, the conductivities of the P-type Si substrate 102a and the N-type epitaxial layer 102b may be reversed. Specifically, the optical semiconductor device may include a substrate prepared by forming a P-type epitaxial layer on an N-type Si substrate.

What is claimed is:

1. An optical semiconductor device comprising:
   a first light receiving region and a second light receiving region provided on a substrate and respectively include light receiving elements photoelectrically converting an incident light; and
   a first anti-reflection film formed over the light receiving elements included in the first light receiving region of the substrate and a second anti-reflection film formed over the light receiving elements included in the second light receiving region of the substrate, wherein
   the first anti-reflection film is not formed over the light receiving elements included in the second light receiving region of the substrate,
   the second anti-reflection film is not formed over the light receiving elements included in the first light receiving region of the substrate,
   the reflectance of the first anti-reflection film for a first wavelength range of light is lower than the reflectance of the second anti-reflection film for the first wavelength range of light, and
   the reflectance of the second anti-reflection film for a second wavelength range of light which is different from the first wavelength range of light is lower than the reflectance of the first anti-reflection film for the second wavelength range of light.

2. The optical semiconductor device of claim 1, wherein the first anti-reflection film and the second anti-reflection film are made of different materials.

3. The optical semiconductor device of claim 1, wherein the first anti-reflection film is thicker than the second anti-reflection film.

4. The optical semiconductor device of claim 1, wherein the first anti-reflection film and the second anti-reflection film are made of silicon nitride films, respectively, and the silicon nitride film serving as the first anti-reflection film is implanted with impurities such that the refractive index of the first anti-reflection film is varied from the refractive index of the second anti-reflection film.

5. The optical semiconductor device of claim 1, wherein the first anti-reflection film is a layered film including a plurality of films and the second anti-reflection film is a single-layered film.

6. The optical semiconductor device of claim 5, wherein the first anti-reflection film is a layered film including a silicon oxide film and a silicon nitride film and the second anti-reflection film is a single-layered film made of a silicon oxide film.

7. The optical semiconductor device of claim 5, wherein the first anti-reflection film is a layered film including a silicon oxide film and a silicon nitride film and the second anti-reflection film is a single-layered film made of a silicon nitride film.

* * * * *